(12) United States Patent
Zhang et al.

(10) Patent No.: US 11,848,344 B2
(45) Date of Patent: Dec. 19, 2023

(54) PIXEL STRUCTURE, IMAGE PROCESSING METHOD AND CONTROL METHOD

(71) Applicant: SMARTSENS TECHNOLOGY (HK) CO., LIMITED, Kowloon (HK)

(72) Inventors: Shengxin Zhang, Shanghai (CN); Chen Xu, Shanghai (CN); Guanjing Ren, Shanghai (CN); Xiaoyong Wang, Shanghai (CN); Jiaqing Hou, Shanghai (CN)

(73) Assignee: SMARTSENS TECHNOLOGY (HK) CO., LIMITED, Kowloon OT (HK)

( * ) Notice: Subject to any disclaimer, the term of this patent is extended or adjusted under 35 U.S.C. 154(b) by 31 days.

(21) Appl. No.: 17/564,882

(22) Filed: Dec. 29, 2021

(65) Prior Publication Data
US 2023/0083135 A1 Mar. 16, 2023
US 2023/0268360 A9 Aug. 24, 2023

(30) Foreign Application Priority Data

Sep. 6, 2021 (CN) .......................... 202111038543.9

(51) Int. Cl.
*H01L 27/146* (2006.01)
*H04N 25/76* (2023.01)

(52) U.S. Cl.
CPC .... *H01L 27/14621* (2013.01); *H01L 27/1461* (2013.01); *H04N 25/76* (2023.01)

(58) Field of Classification Search
CPC ........... H01L 27/14621; H01L 27/1461; H01L 27/14605; H01L 27/14627; H01L 27/1463; H01L 27/14645; H01L 27/14654; H01L 27/14612; H01L 27/1464; H01L 27/14641; H04N 25/76; H04N 23/73; H04N 23/741; H04N 23/745; H04N 23/45; H04N 23/58; H04N 25/134; H04N 25/581; H04N 25/59;
(Continued)

(56) References Cited

U.S. PATENT DOCUMENTS

2015/0221071 A1* 8/2015 Matsumoto ............ H04N 25/63
382/167
2016/0269655 A1* 9/2016 Numata .............. H01L 27/1461
(Continued)

*Primary Examiner* — Lin Ye
*Assistant Examiner* — Tuan H Le
(74) *Attorney, Agent, or Firm* — Alston & Bird LLP

(57) ABSTRACT

The present application provides a pixel structure, an image sensor, a device, an image processing method and a control method. The pixel structure includes a plurality of first pixels and a plurality of second pixels, where the first pixels adopt first photoelectric conversion elements arranged in an array and provided with high sensitivity, and the second pixels adopt second photoelectric conversion elements arranged in an array and provided with low sensitivity, to realize compatible recognition of high-brightness information and low-light information by the image sensor and improving the dynamic range; the first photoelectric conversion elements and the second photoelectric conversion elements adopt a design of independent output circuits to realize separate output of electrical signals without interfering with each other, which improves recognition reliability and signal utilization recognition; the overall performance of the image sensor can also be improved based on layout of the pixel structure of the present application.

20 Claims, 14 Drawing Sheets

(58) Field of Classification Search
CPC ...... H04N 25/778; H04N 25/70; H04N 25/75; H04N 25/65; H04N 25/766
See application file for complete search history.

(56) References Cited

U.S. PATENT DOCUMENTS

| | | | |
|---|---|---|---|
| 2017/0221947 A1* | 8/2017 | Shishido | H01L 27/14612 |
| 2022/0123033 A1* | 4/2022 | Park | H04N 25/59 |
| 2023/0018370 A1* | 1/2023 | Asatsuma | H04N 25/77 |

* cited by examiner

PIXEL STRUCTURE, IMAGE PROCESSING METHOD AND CONTROL METHOD

CROSS-REFERENCE TO RELATED APPLICATIONS

The present application claims priority to Chinese Patent Application No. 202111038543.9, filed on Sep. 16, 2021 and entitled "PIXEL STRUCTURE, IMAGE SENSOR, DEVICE, IMAGE PROCESSING METHOD AND CONTROL METHOD", the content of which is incorporated herein by reference thereto in its entity.

TECHNICAL FIELD

The present application relates to the technical field of image sensors, and particularly to a pixel structure, an image sensor, a device, an image processing method and a control method.

BACKGROUND

Image sensors are important parts of digital cameras. According to different components, the image sensors may be divided into two categories: CCD (Charge-coupled Device) and CMOS (Complementary Metal Oxide Semiconductor). With continuous development of a manufacturing process of CMOS integrated circuits, especially of a design and manufacturing process of CMOS image sensors, the CMOS image sensors have gradually replaced CCD image sensors to become a mainstream. In comparison, the CMOS image sensors have advantages of higher industrial integration and lower power.

Existing standard image sensors have a limited dynamic range approximately from 60 dB to 70 dB. However, the dynamic range of brightness in the real world is much larger. A natural scene usually spans a range of 90 dB and above. To capture strong light and a shadow at the same time, a high dynamic range (HDR) technology has been used in the image sensors to increase the captured dynamic range. The most common technique for increasing the dynamic range is to combine multiple exposure images captured with a standard (low dynamic range) image sensor into a single linear HDR image that has a much greater dynamic ranger than a single exposure image. However, in the prior art, it is difficult to take into account the performance of the image sensor and at the same time enable the dynamic range to be effectively improved. In addition, sometimes it is necessary to photograph an environment where flickering occurs, for example, a vehicle is equipped with a variety of in-vehicle devices including an image sensor for recognizing a traffic sign, where the traffic sign includes a signal light composed of an LED lamp provided with a extremely high flickering frequency. A traditional in-vehicle image sensor uses a single pixel for recognition, which cannot be compatible with low-light information and high-brightness information during recognition, causing misjudgment of the traffic sign, thereby in turn causing a major traffic accident.

Therefore, it is necessary to provide a pixel structure, an image sensor, an electronic device, an image processing method and an image sensor control method to solve the above-mentioned problems in the prior art.

SUMMARY

The present application is aimed to provide an image sensor, and is intended to solve the problems that the dynamic range of the conventional image sensors is difficult to be improved and the conventional image sensors cannot be compatibly recognize low-light information and high-brightness light information, and the like.

A first aspect of embodiments of the present application provides a pixel structure, which includes a plurality of first pixels and a plurality of second pixels, where each of the first pixels includes:
 a first photoelectric conversion element, here first photoelectric conversion elements of the plurality of first pixels are arranged in an array;
 a first transfer transistor coupled to a first floating diffusion area and configured to transfer charges accumulated by the first photoelectric conversion element to the first floating diffusion area; and
 a first output circuit coupled to the first floating diffusion area and configured to output a voltage signal from the first floating diffusion area;
where each of the second pixels includes:
 a second photoelectric conversion element, here sensitivity of the second photoelectric conversion element is lower than sensitivity of the first photoelectric conversion element, and second photoelectric conversion elements of the plurality of second pixels are arranged in an array;
 a second transfer transistor coupled to a second floating diffusion area and configured to transfer charges accumulated by the second photoelectric conversion element to the second floating diffusion area; and
 a second output circuit coupled to the second floating diffusion area and configured to output a voltage signal from the second floating diffusion area.
Optionally, the second pixel further includes:
 a charge storage element, one terminal of the charge storage element being coupled to the second floating diffusion area and another terminal of the charge storage element being grounded or connected to a variable voltage.

Optionally, each of the second photoelectric conversion elements is arranged at a center position of corresponding four of the first photoelectric conversion elements arranged in an array, and adjacent two rows and/or adjacent two columns of the second photoelectric conversion elements are correspondingly provided with adjacent two rows and/or adjacent two columns of the first photoelectric conversion elements therebetween.

Optionally, the first photoelectric conversion elements are divided into a plurality of first photoelectric conversion element groups, the plurality of first photoelectric conversion element groups are arranged in an array, each of the first photoelectric conversion element groups includes four of the first photoelectric conversion elements arranged at adjacent rows and adjacent columns, each of the second photoelectric conversion elements is arranged at a center position of the four first photoelectric conversion elements of corresponding one of the first photoelectric conversion element groups, and adjacent two of the first photoelectric conversion element groups are not provided with the second photoelectric conversion element therebetween;
 each of the first photoelectric conversion elements in each of the first photoelectric conversion element groups is correspondingly coupled to the same first floating diffusion area and the same first output circuit through corresponding one of the first transfer transistors.

Optionally, the same first floating diffusion area includes four floating diffusion nodes correspondingly coupled to the first photoelectric conversion elements; and/or the same first output circuit includes four output sub-circuits correspondingly coupled to the first photoelectric conversion elements.

Optionally, the pixel structure further includes:

a plurality of first lenses, here each of the first lenses covers corresponding one of the first photoelectric conversion element groups and focuses light incident on the first photoelectric conversion elements and the second photoelectric conversion element;

and/or the pixel structure further includes:

a plurality of first color filters, here each of the first color filters is disposed relative to corresponding one of the first photoelectric conversion element groups and the second photoelectric conversion element correspondingly arranged at the center position thereof, here the plurality of first color filters are divided into multiple groups of first color filter groups, and each of the first color filter groups includes corresponding four of the first color filters arranged in an array and transmitting wavelength components of different colors.

Optionally, the pixel structure further includes:

a plurality of first lenses, here each of the first lenses covers corresponding one of the first photoelectric conversion elements and focuses light incident on the corresponding one first photoelectric conversion element; and a plurality of second lenses, here each of the second lenses covers corresponding one of the second photoelectric conversion elements and focuses light incident on the corresponding second photoelectric conversion element;

and/or, the pixel structure further includes:

a plurality of first color filters, here each of the first color filters is disposed relative to corresponding one of the first photoelectric conversion elements, here the plurality of first color filters are divided into multiple groups of first color filter groups, and each of the first color filter groups includes corresponding four of the first color filters arranged in an array and transmitting wavelength components of different colors; and a plurality of second color filters, here each of the second color filters is disposed relative to corresponding one of the second photoelectric conversion elements, here the plurality of second color filters are divided into multiple groups of second color filter groups, and each of the second color filter groups includes corresponding four of the second color filters arranged in an array and transmitting wavelength components of different colors.

Optionally, the pixel structure further includes:

virtual lenses located at center positions of corresponding four of the first lenses, here the virtual lenses and the second lenses fill the center positions of any four of the first lenses.

Optionally, the four first photoelectric conversion elements in each of the first photoelectric conversion element groups are arranged as a matrix and form a row-direction space area and a column-direction space area;

the first transfer transistors connected to the first photoelectric conversion elements in each of the first photoelectric conversion element groups are arranged at an oblique angle at corners of their corresponding first photoelectric conversion elements, and are connected to the same first floating diffusion area and the same first output circuit through connection wires, and the first output circuit is arranged along the row-direction and/or column-direction space area in each of the first photoelectric conversion element groups.

Optionally, the first photoelectric conversion elements are divided into a plurality of first photoelectric conversion element groups, the plurality of first photoelectric conversion element groups are arranged in an array, each of the first photoelectric conversion element groups includes corresponding four of the first photoelectric conversion elements arranged at adjacent rows and adjacent columns, and each of the second photoelectric conversion elements is arranged at a center position of the corresponding four of the first photoelectric conversion element groups arranged at adjacent rows and adjacent columns;

each of the first photoelectric conversion elements in each of the first photoelectric conversion element groups is respectively coupled to the same first floating diffusion area and the same first output circuit through corresponding one of the first transfer transistors.

Optionally, the same first floating diffusion area includes two floating diffusion nodes with each shared by two of the first photoelectric conversion elements; and/or, the same first output circuit includes one output circuit shared by corresponding four of the first photoelectric conversion elements.

Optionally, the pixel structure includes:

a plurality of first lenses, here each of the first lenses covers corresponding one of the first photoelectric conversion element groups and focuses light incident on the corresponding first photoelectric conversion elements; and a plurality of second lenses, here each of the second lenses covers corresponding one of the second photoelectric conversion elements and focuses light incident on the corresponding second photoelectric conversion element;

and/or, the pixel structure further includes:

a plurality of first color filters, here each of the first color filters is disposed relative to corresponding one of the first photoelectric conversion element groups, here the plurality of first color filters are divided into multiple groups of first color filter groups, and each of the first color filter groups includes corresponding four of the first color filters arranged in an array and transmitting wavelength components of different colors; and a plurality of second color filters, here each of the second color filters is disposed relative to corresponding one of the second photoelectric conversion elements, here the plurality of second color filters are divided into multiple groups of second color filter groups, and each of the second color filter groups includes corresponding four of the second color filters arranged in an array and transmitting wavelength components of different colors.

Optionally, the four first photoelectric conversion elements in each of the first photoelectric conversion element groups are arranged as a matrix and form a row-direction space area and a column-direction space area, the first transfer transistors connected to the photoelectric conversion elements in each of the first photoelectric conversion element groups are arranged at an oblique angle at corners of corresponding first photoelectric conversion elements to form an opening and are connected to the same first floating diffusion area and the same first output circuit, and the first output circuit is arranged along the row-direction and/or column-direction space area in each of the first photoelectric conversion element groups.

Optionally, the first photoelectric conversion elements are divided into a plurality of first photoelectric conversion element groups, the plurality of first photoelectric conversion element groups are arranged in an array, each of the first photoelectric conversion element groups includes two first photoelectric conversion elements arranged at adjacent two columns, each of the second photoelectric conversion elements is arranged at a center position of four of the first photoelectric conversion element groups arranged at adjacent rows and adjacent columns, and adjacent two columns of the second photoelectric conversion elements are provided with adjacent two columns of the first photoelectric conversion elements therebetween;

each of the first photoelectric conversion elements in each of the first photoelectric conversion element groups is respectively coupled to the same first floating diffusion area and the same first output circuit through corresponding one of the first transfer transistors.

Optionally, the same first floating diffusion area includes one floating diffusion node shared by two of the first photoelectric conversion elements; and/or, the same first output circuit includes one output circuit shared by the corresponding two first photoelectric conversion elements.

Optionally, the pixel structure includes:
    a plurality of first lenses, here each of the first lenses covers corresponding one of the first photoelectric conversion elements and focuses light incident on the corresponding first photoelectric conversion element; and
    a plurality of second lenses, here each of the second lenses covers corresponding one of the second photoelectric conversion elements and focuses light incident on the corresponding second photoelectric conversion element;
    and/or, the pixel structure includes:
    a plurality of first color filters, here each of the first color filters is arranged relative to corresponding one of the first photoelectric conversion elements, here the plurality of first color filters are divided into multiple groups of first color filter groups, and each of the first color filter groups includes corresponding four of the first color filters arranged in an array and transmitting wavelength components of different colors; and
    a plurality of second color filters, here each of the second color filters is disposed relative to corresponding one of the second photoelectric conversion elements, and the plurality of second color filters are divided into multiple groups of second color filter groups, here each of the second color filter groups includes corresponding four of the second color filters arranged in an array and transmitting wavelength components of different colors or includes corresponding eight of the second color filters arranged in an array and transmitting wavelength components of different colors.

Optionally, the two first photoelectric conversion elements in each of the first photoelectric conversion element groups are arranged along a column direction to form a row-direction space area, and adjacent two of the first photoelectric conversion element groups are arranged along a row direction to form a column-direction space area;

the first transfer transistors connected to the first photoelectric conversion elements in each of the first photoelectric conversion element groups are arranged at an oblique angle at corners of their corresponding first photoelectric conversion elements, and are connected to the same first floating diffusion area and the same first output circuit through connection wires, and each of the output circuits is arranged along the row-direction space area in each of the first photoelectric conversion element groups and/or the column-direction space area of corresponding adjacent two of the first photoelectric conversion element groups.

Another aspect of the present application further provides an image sensor, which includes the pixel structure of any of the foregoing solutions.

Another aspect of the present application further provides an electronic device, which includes the pixel structure according to any of the foregoing solutions.

Still another aspect of the present application further provides an image processing method for an image sensor, which is applied to the image sensor of the foregoing solutions and includes:

acquiring a first image based on the first photoelectric conversion elements;
    acquiring a second image based on the second photoelectric conversion elements;
    performing interpolation processing such that the number of pixel values in the second image corresponding to the second photoelectric conversion elements is equal to the number of pixel values in the first image corresponding to the first photoelectric conversion elements.

Optionally, the interpolation processing includes:
    performing at least one multiplication and interpolation process on the second image to acquire a multiplication image, here the second image serves as an initial image currently to be interpolated, and during each multiplication and interpolation process:
    the image currently to be interpolated is processed to be an updated interpolated image, and the number of pixel values in the updated interpolated image is at least twice the number of the pixel values in the image currently to be interpolated, here the pixel values in the updated interpolated image include first pixel values and second pixel values, the first pixel values have one-to-one correspondence with the pixel values in the image currently to be interpolated, and the second pixel values are acquired through interpolation on the pixel values of the image currently to be interpolated.

Still another aspect of the present application further provides an image sensor control method, which is applied to the image sensor of any of the foregoing solutions and includes:

reading out information of the first pixels, specifically comprising: resetting a storage area in the first pixels, and quantizing to obtain a first image reset signal; and transmitting image information corresponding to the first photoelectric conversion elements, and quantizing to obtain a first image sampling signal; and
    reading out information of the second pixels, specifically comprising: transmitting image information corresponding to the second photoelectric conversion elements, and quantizing to obtain a second image sampling signal;
    here, a first actual image signal of the first pixels is acquired based on the first image reset signal and the first image sampling signal, and a second actual image signal of the second pixels is acquired based on the second image sampling signal.

Optionally, the reading out the information of the second pixels further includes:
    resetting a storage area in the second pixels, and quantizing to acquire a second image reset signal, and acquiring the second actual image signal based on the second image reset signal and the second image sampling signal.

Optionally, readout of the first pixels includes at least one of readout under a low conversion gain mode and readout under a high conversion gain mode, here when both the readout under the low conversion gain mode and the readout under the high conversion gain mode are adopted for the first pixels, the readout of the first pixels includes steps of:

resetting the storage area in the first pixels under the low conversion gain mode, and quantizing to acquire a first image reset signal under the low conversion gain mode;

resetting the storage area in the first pixels under the high conversion gain mode, and quantizing to acquire a first image reset signal under the high conversion gain mode;

transmitting the image information corresponding to the first photoelectric conversion elements under the high conversion gain mode, and quantizing to acquire a first image sampling signal under the high conversion gain mode;

reassigning the image information corresponding to the first photoelectric conversion elements under the low conversion gain mode, and quantizing to acquire a first image sampling signal under the low conversion gain mode;

here the first actual image signal of the first pixels is acquired based on the first image reset signal and the first image sampling signal under the low conversion gain mode and the first image reset signal and the first image sampling signal under the high conversion gain mode.

The present application adopts the first pixels and the second pixels, the first photoelectric conversion elements provided with high sensitivity (such as a large area) and arranged in an array are used in the first pixels to expose and acquire the low-light information, and the second photoelectric conversion elements arranged in an array and provided with low sensitivity (such as a small area) are used in the second pixels to expose and acquire high-brightness light information, so as to realize the purposes of compatible recognition of the high-brightness information and the low-light information by the image sensor and improving the dynamic range; additionally, the first photoelectric conversion elements and the second photoelectric conversion elements adopt a design of independent output circuits to realize separate output of electrical signals without interfering with each other, which improves recognition reliability and signal utilization recognition; moreover, the overall performance of the image sensor can also be improved based on the layout of the pixel structure of the present application.

DETAILED EMBODIMENTS

Figure 1:
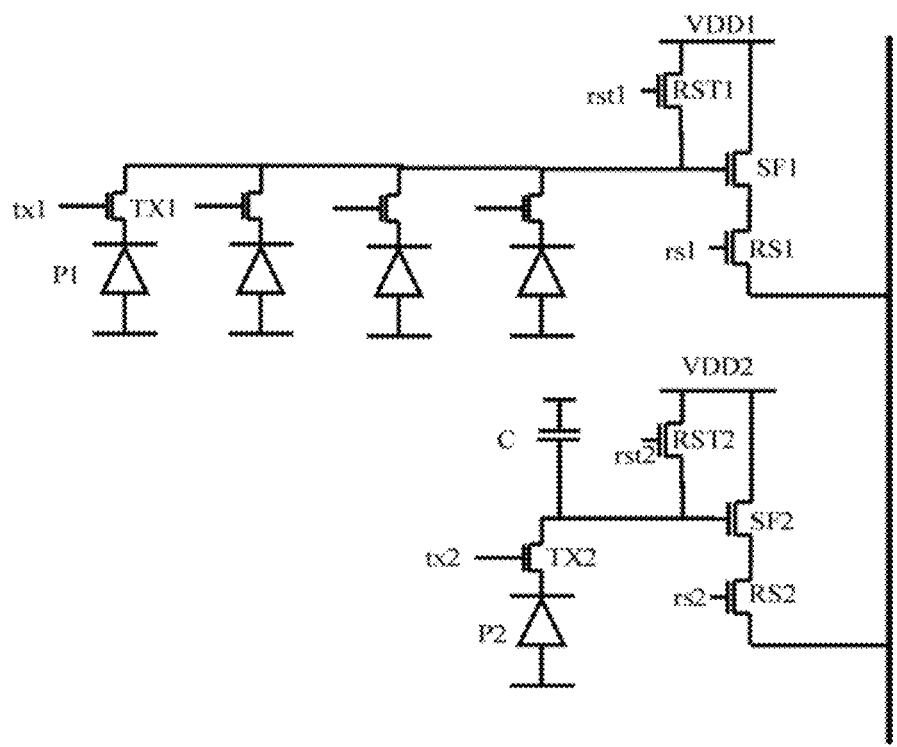
FIG. 1 is a first schematic diagram of a pixel circuit of the pixel structure provided by an embodiment of the present application.

In order to make the technical problems to be solved, technical solutions, and beneficial effects of the present application more clear, the present application will be further described in detail hereinbelow with reference to the accompanying drawings and embodiments. It should be understood that the specific embodiments described herein are merely intended to explain the present application rather than to limit the present application.

It should be understood that orientations or positional relationships indicated by the terms such as "length", "width", "upper", "lower", "front", "rear", "left", "right", "vertical", "horizontal", "top", "bottom", "inner", "outer" etc. are based on orientations or positional relationships as shown in the drawings, which are only intended to facilitate describing the present application and simplifying the description rather than to indicate or imply that a specified device or the element must have a specific orientation or be constructed and operated in a specific orientation, and therefore cannot be understood as a limitation of the present application.

In addition, the terms "first" and "second" are only used for a descriptive purpose, and cannot be understood as an indication or implication of relative importance or an implicit indication of the number of a specified technical feature. Therefore, the feature defined with "first" or "second" may explicitly or implicitly include one or more of these features. In the description of the present application, the phrase "a plurality of" means two or more, unless otherwise explicitly and specifically defined.

First Embodiment

A first aspect of the embodiments of the present application provides a pixel structure.

Figure 2:
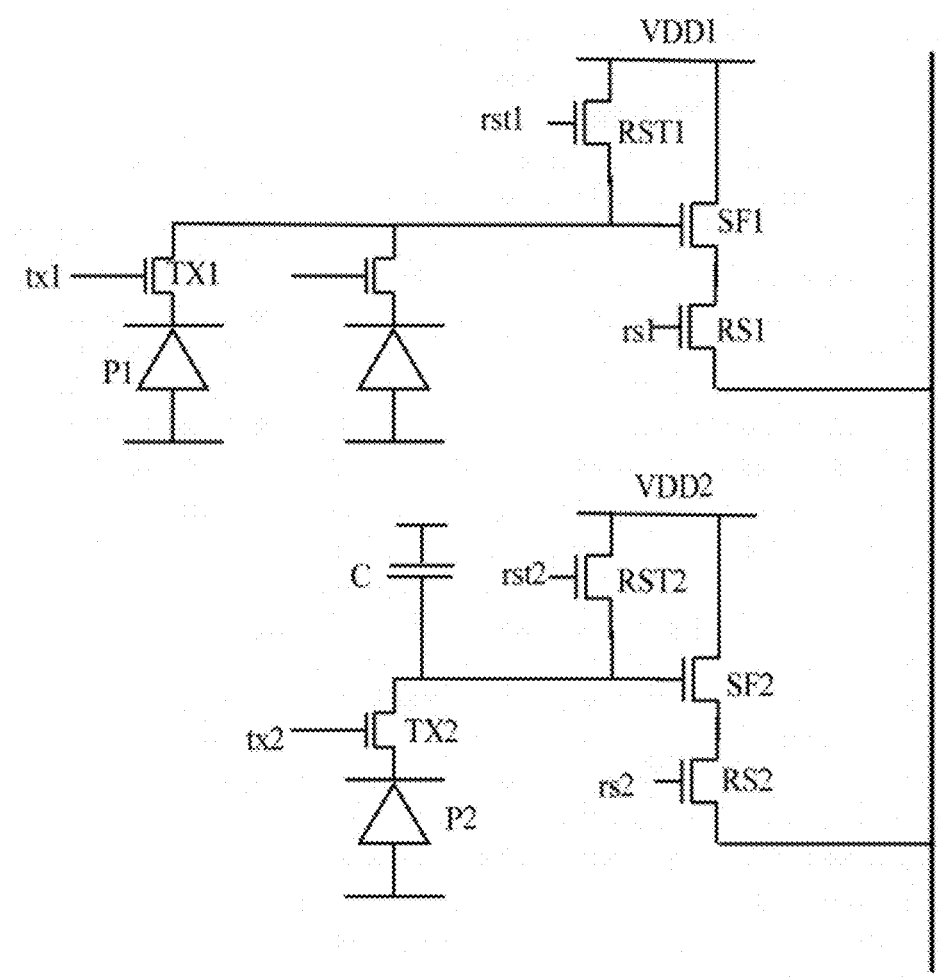
FIG. 2 is a second schematic diagram of a pixel circuit of the pixel structure provided by an embodiment of the present application.

The pixel structure provided by the present application includes a plurality of first pixels and a plurality of second pixels. As shown in FIG. 1 or FIG. 2, the first pixel includes:

a first photoelectric conversion element P1 capable of exposing and capturing low-light information to convert a light signal into an electrical signal, here the first photoelectric conversion elements P1 is arranged in an array; additionally the first photoelectric conversion element P1 includes but is not limited to a photodiode, such as a Pin-type photodiode;

a first transfer transistor TX1 coupled to a first floating diffusion area and configured to transfer charges accumulated by the first photoelectric conversion elements P1 to the first floating diffusion area; it should be noted that the first floating diffusion area may be a shared charge collection region or may include several floating diffusion points, and the charges collected by all the floating diffusion points are the charges collected by the first floating diffusion area; and a first output circuit coupled to the first floating diffusion area and configured to output a voltage signal from the first floating diffusion area; for example, the first output circuit may include a first reset transistor RST1 coupled to a first voltage terminal VDD1 and configured to reset the voltage of the first floating diffusion area; additionally, the first output circuit may further include a first row selection transistor RS1 and a first source follower diode SF1, and a gate of the first source follower diode SF1 is connected to the first floating diffusion area. Of course, the first output circuit may also be other existing circuit structure used for charge signal output from an image sensor.

The second pixel includes:

a second photoelectric conversion element P2 capable of exposing and capturing high-brightness light information to convert a light signal into an electrical signal, here the second photoelectric conversion element P2 is arranged in an array; additionally, the second photoelectric conversion element P2 includes but is not limited to a photodiode, for example, the second photoelectric conversion element P2 may be a pin-type photodiode; here, sensitivity of the second photoelectric conversion element is lower than sensitivity of the first photoelectric conversion element, and an area corresponding to a light receiving surface of the first photoelectric conversion element P1 may be made larger than an area of a light receiving surface of the second photoelectric conversion element P2, so that the second photoelectric conversion element has a lower sensitivity;

a second transfer transistor TX2 coupled to a second floating diffusion area and configured to transfer charges accumulated by the second photoelectric conversion element P2 to the second floating diffusion area; and a second output circuit coupled to the second floating diffusion area and configured to output a voltage signal from the second floating diffusion area. For example, the second output circuit may include a second reset transistor RST2 coupled to a second voltage terminal VDD2 and configured to reset the voltage of the second floating diffusion area; additionally, the second output circuit may further include a second row selection transistor RS2 and a second source follower diode SF2, a gate of the second source follower diode SF2 is connected to the second floating diffusion. Of course, the second output circuit may also be other existing circuit structure used for charge signal output from an image sensor.

Additionally, as an example, the first pixel and the second pixel may further be coupled to a row driving circuit and a column driving circuit correspondingly, where the row driving circuit is configured to provide a row control signal to the first pixel and the second pixel, and the column driving circuit is configured to provide a column selection signal to the first pixel and the second pixel.

During working, the row driving circuit correspondingly outputs different control signals to the various transistors through a row signal bus to control turn-on and turn-off of the corresponding transistors, and then selectively outputs electrical signals from various column signal buses to a back-end signal processing unit, and resets and initializes the corresponding floating diffusion area.

The large-area first photoelectric conversion element P1 can obtain the low-light information through continuous exposure, and the small-area second photoelectric conversion element P2 can obtain high-brightness light information through continuous exposure, so that the purpose that the image sensor is compatible in recognizing the high-brightness light information and the low-light information is achieved, thereby achieving recognition of traffic signs provided with different light brightness and improving recognition accuracy. Of course, the second photoelectric conversion element P2 may also work in an intermittent exposure mode. Additionally, the first photoelectric conversion element P1 and the second photoelectric conversion element P2 adopt independent output circuit structures to achieve separate output of electrical signals without interfering with each other, which improves recognition reliability and signal utilization flexibility.

As an example, the second pixel further includes: a charge storage element (for example, it may be a capacitor C), one terminal of the charge storage element is coupled to the second floating diffusion area, and the other terminal is grounded or connected to a variable voltage. Among them, the charge storage element may be configured to store charges generated by the second transfer transistor TX2, which is thereby beneficial to increase a full well capacity of the second pixel, and increase the full well capacity while reducing the sensitivity of the photoelectric conversion element. Optionally, the capacitor C may be a separate capacitor device or a parasitic capacitor.

In an example, each of the second photoelectric conversion elements P2 is disposed at a center of the four first photoelectric conversion elements P1 arranged in an array. Furthermore, adjacent two rows of first photoelectric conversion elements P1 are arranged between adjacent two rows of second photoelectric conversion elements P2, that is, two rows of first photoelectric conversion elements P1 arranged adjacently are provided between the adjacent two rows of second photoelectric conversion elements P2; optionally, adjacent two columns of first photoelectric conversion elements P1 are arranged between adjacent two columns of second photoelectric conversion elements P2; optionally, adjacent two rows of first photoelectric conversion elements P1 are arranged between adjacent two rows of second photoelectric conversion elements P2, and at the same time, adjacent two columns of first photoelectric conversion elements P1 are arranged between adjacent two columns of second photoelectric conversion elements P2.

It should be noted that the statement "between adjacent two rows of second photoelectric conversion elements P2" is based on a position that can be understood by those skilled in the art according to the drawings of the embodiments, which does not strictly represents a space of the two rows of second photoelectric conversion elements P2 formed relative to each other. For example, the term "between" may be understood as an area between relative centers of the second photoelectric conversion elements P2 of the two rows of second photoelectric conversion elements P2.

Specifically, the first photoelectric conversion elements P1 are arranged in an array, and the second photoelectric conversion elements P2 are arranged in an array. Each second photoelectric conversion element P2 is arranged at the center of four first photoelectric conversion elements P1 arranged in an array and adjacent two rows and/or adjacent two columns of first photoelectric conversion elements P1 are correspondingly arranged between adjacent two rows and/or adjacent two columns of second photoelectric conversion elements P2. Here, one second photoelectric conversion element P2 may be arranged corresponding to two first photoelectric conversion elements P1 or corresponding to four first photoelectric conversion elements P1.

Figure 3:
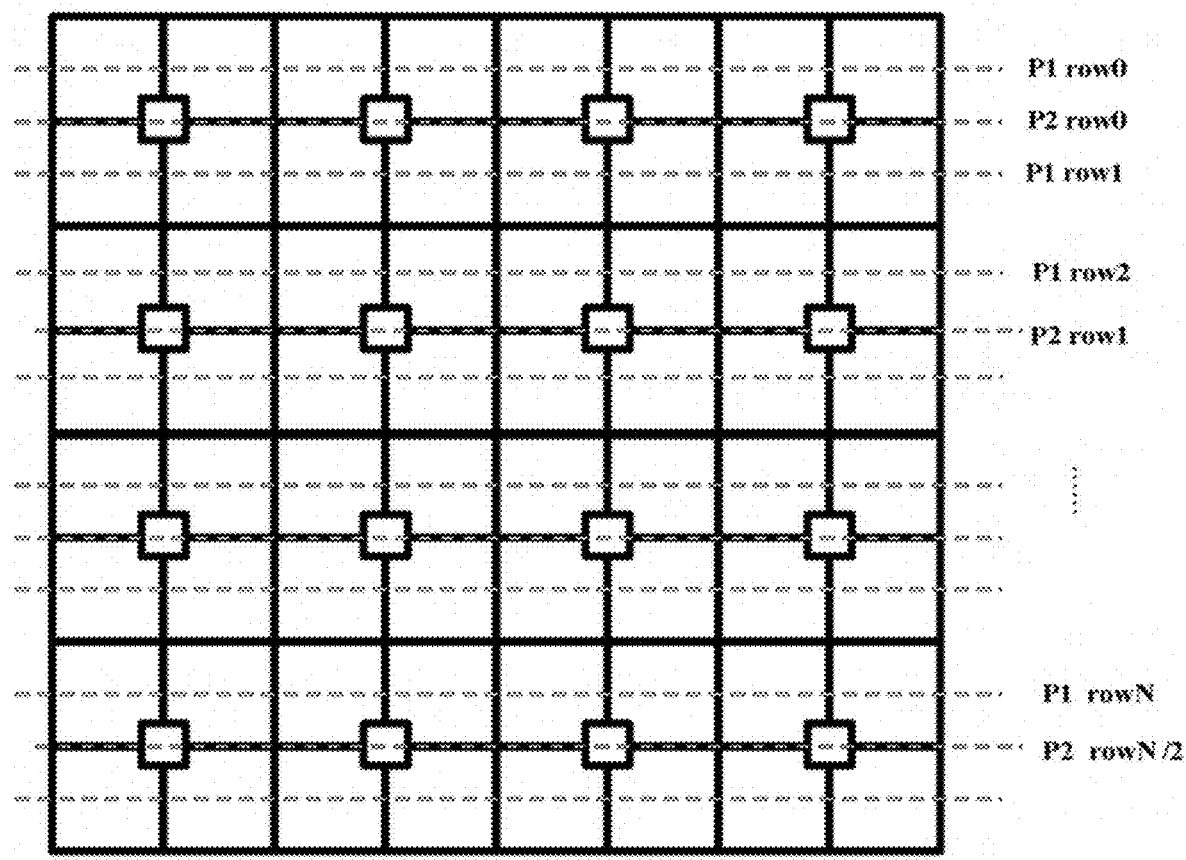
FIG. 3 is a first structural schematic diagram of the pixel structure provided by an embodiment of the present application.
Figure 7:
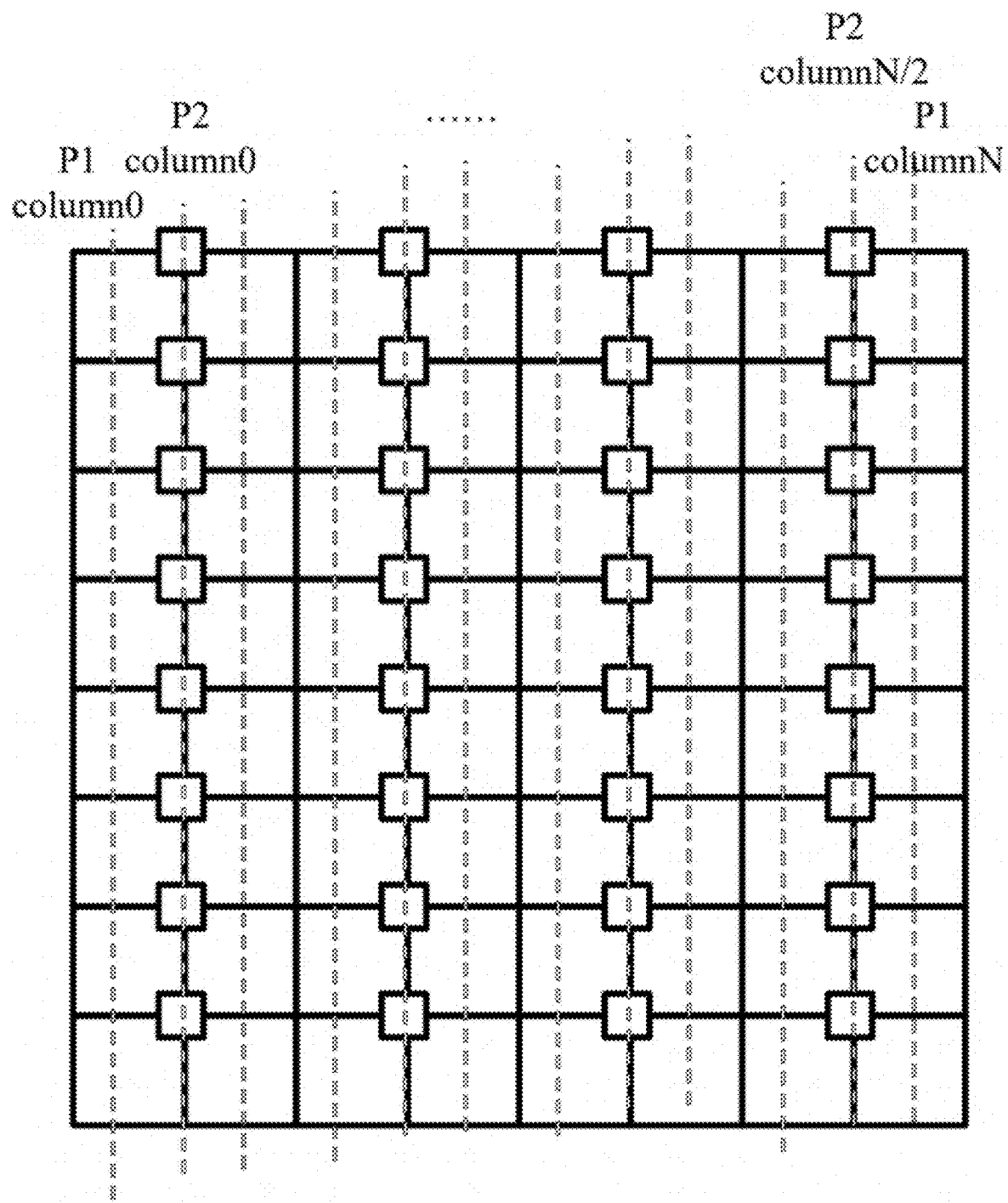
FIG. 7 is a fifth structural schematic diagram of the pixel structure provided by an embodiment of the present application.

As shown in FIG. 3, four first photoelectric conversion elements in adjacent rows or adjacent columns form one first photoelectric conversion element group, and one second photoelectric conversion element P2 is provided at a center of the first photoelectric conversion element group; optionally, as shown in FIG. 7, two first photoelectric conversion elements arranged at two columns and one single row form one first photoelectric conversion element group, and two second photoelectric conversion elements P2 are formed between two first photoelectric conversion element groups arranged in the row direction. Of course, the specific distribution structure of the first photoelectric conversion elements P1 and the second photoelectric conversion elements P2 may be specifically arranged based on actual requirements according to designs of the technical solutions of the present application.

At the same time, the plurality of first photoelectric conversion elements P1 provided in the second photoelectric conversion elements P2 may be correspondingly coupled to the same floating diffusion region through the transfer transistors according to a layout mode, that is, the plurality of first photoelectric conversion elements P1 are coupled to the first floating diffusion area, correspondingly, the second photoelectric conversion elements P2 are coupled to the second floating diffusion area. Further, the two types of photoelectric conversion elements correspondingly output voltage signals through the same output circuit. For example, as shown in FIG. 1, the four first photoelectric conversion elements P1 are coupled to the first floating diffusion area through the corresponding transfer transistors, and the second photoelectric conversion elements P2 are coupled to the second floating diffusion area through the corresponding transfer transistors; optionally, as shown in FIG. 2, the two first photoelectric conversion elements P1 are coupled to the first floating diffusion area through the corresponding transfer transistors, and the second photoelectric conversion elements P2 are coupled to the second floating diffusion area through the corresponding transfer transistors. Additionally, in other embodiments, the specific number of parallel connections may be specifically set according to the distribution of the first photoelectric conversion elements P1 and the second photoelectric conversion elements P2 and requirements.

Additionally, an output terminal of the first output circuit and an output terminal of the second output circuit may be connected to the same output bus (as shown in FIG. 1 and FIG. 2), alternatively, the output terminal of the first output circuit and the output terminal of the second output circuit may be connected to different output buses separately, which may be arranged according to the layout of the image sensor and actual needs.

The first photoelectric conversion elements P1 and the second photoelectric conversion elements P2 are arranged in a cross array, and a plurality of active regions are reserved between the first photoelectric conversion elements P1 and the second photoelectric conversion elements P2 at adjacent rows and adjacent columns, and the transfer transistors, the reset transistors, the row selection transistors and the source follower diodes are correspondingly arranged in the active areas of nearby photodiodes, thereby forming corresponding large and small pixels.

Second Embodiment

Figure 4:
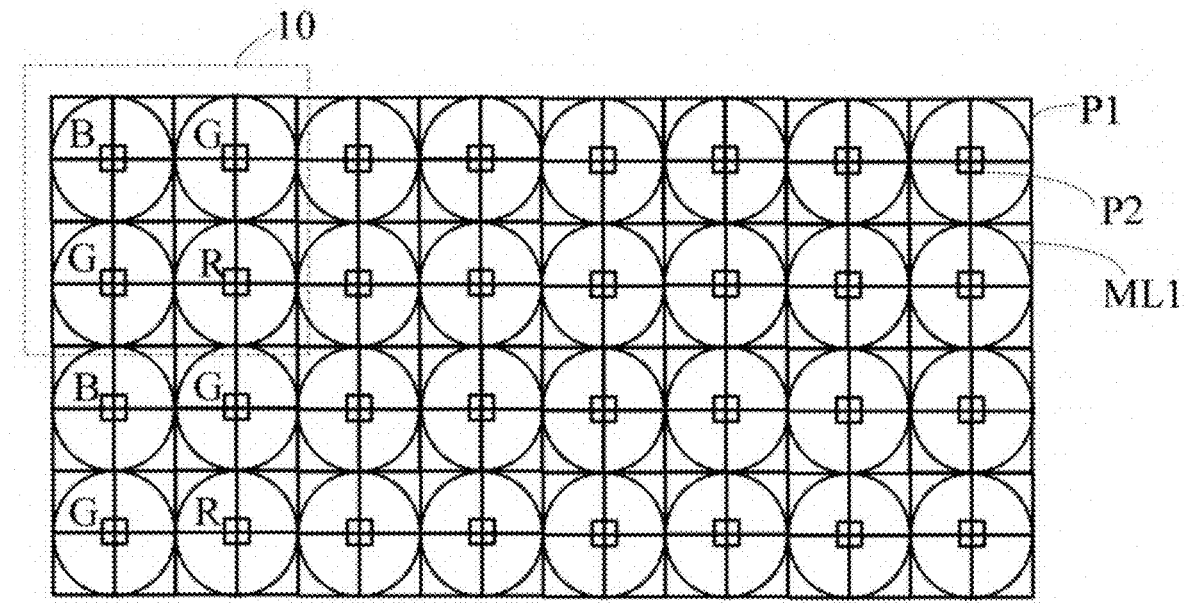
FIG. 4 is a second structural schematic diagram of the pixel structure provided by an embodiment of the present application.
Figure 6:
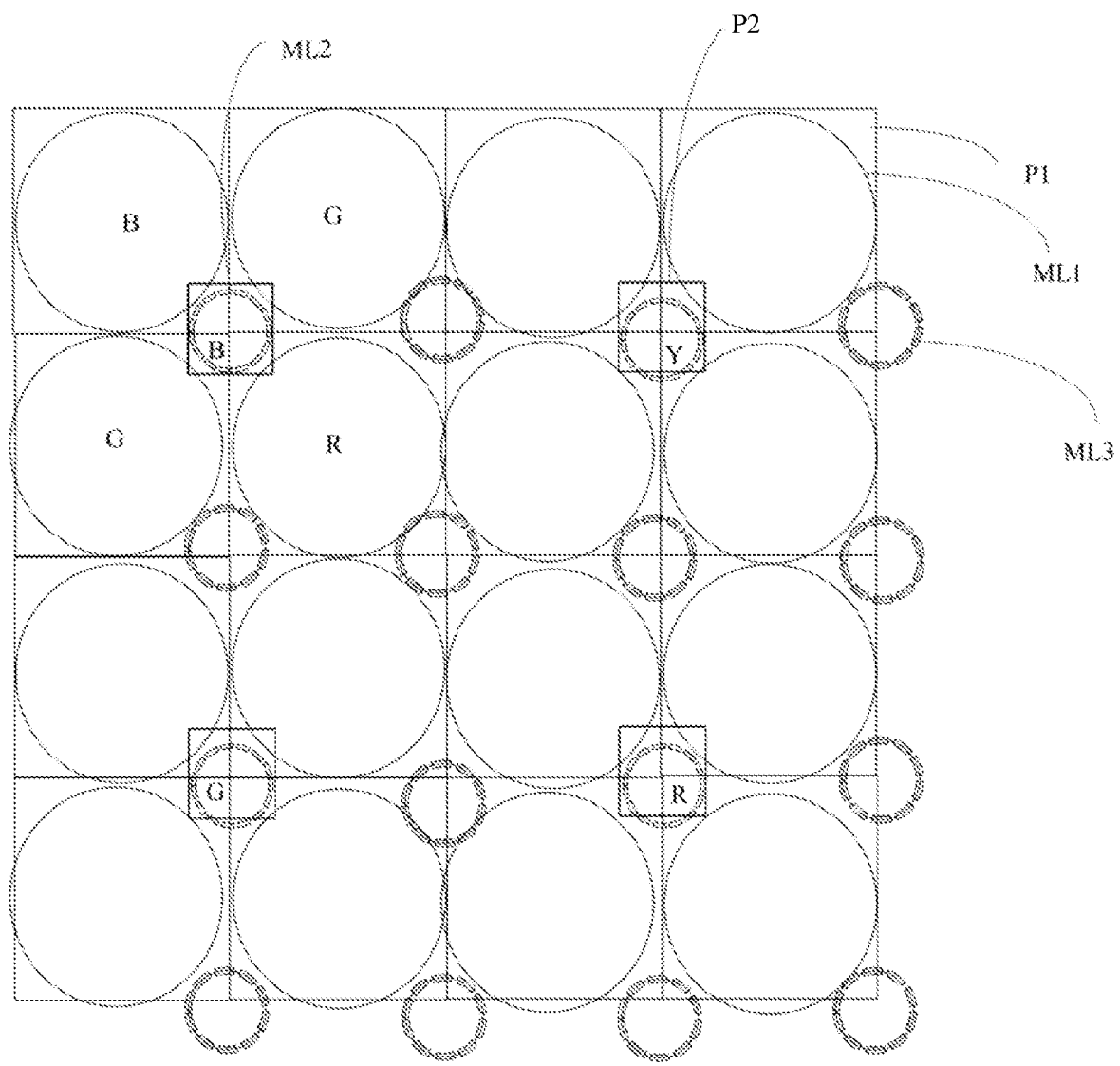
FIG. 6 is a fourth structural schematic diagram of the pixel structure provided by an embodiment of the present application.

The present application is described more detailedly on the basis of the first embodiment, as shown in FIG. 3, in one embodiment referring to FIGS. 4 and 6, the first photoelectric conversion elements P1 are divided into a plurality of first photoelectric conversion element groups, and the plurality of first photoelectric conversion element groups are arranged in an array, each of the first photoelectric conversion element groups includes four first photoelectric conversion elements P1 arranged at adjacent rows and adjacent columns, and each of the second photoelectric conversion elements P2 is arranged at a center position of the four first photoelectric conversion elements P1 of each of the first photoelectric conversion element groups. Further, each of the second photoelectric conversion elements is arranged at a center position of the four first photoelectric conversion elements of each of the first photoelectric conversion element groups, and adjacent two of the first photoelectric conversion element groups are not provided with the second photoelectric conversion element P2 therebetween.

The first photoelectric conversion elements P1 in each of the first photoelectric conversion element groups are correspondingly coupled to the same first floating diffusion area and the same first output circuit through the first transfer transistors TX1.

In this embodiment, every four first photoelectric conversion elements P1 arranged at adjacent rows and adjacent columns form one first photoelectric conversion element group, and at the same time the four first photoelectric conversion elements P1 in each group are coupled to the same first floating diffusion area through their corresponding transfer transistors, and the correspondingly connected four first transfer transistors TX1 receive the same control signal and are turned on or off synchronously, so that the charges from the four first photoelectric conversion elements P1 are fed back to the same first floating diffusion area, and voltage signals are output through the first output circuit that is commonly coupled to realize the function of the first pixel.

As an example, the same first floating diffusion area includes four floating diffusion nodes that are correspondingly coupled to the first photoelectric conversion elements P1; that is to say, one first photoelectric conversion element P1 corresponds to one transfer transistor and corresponds to one floating diffusion point, and further four floating diffusion points constitute one first floating diffusion area in one first photoelectric conversion element group.

As an example, the same first output circuit includes four output sub-circuits that are correspondingly coupled to the first photoelectric conversion elements P1. That is to say, in this example, one first photoelectric conversion element P1 corresponds to one output sub-circuit, and further four output sub-circuits constitute one first output circuit in one first photoelectric conversion element group. In an optional example, each of the output sub-circuits may include a reset transistor, a source follower transistor, and a row selection transistor.

At the same time, based on the array structure as shown in FIG. 3, in order to realize the incidence of the light signals and the transmission of light signals of light provided with different colors, in one embodiment, as shown in FIG. 4, the pixel structure further includes:

a plurality of first lenses ML1, here each of the first lenses ML1 covers corresponding one of the first photoelectric conversion element groups and focuses the light incident on the first photoelectric conversion elements P1 and the second photoelectric conversion element P2.

Additionally, the pixel structure may further include a plurality of first color filters, and each of the first color filters is disposed relative to corresponding one of the first photoelectric conversion element groups (for example, here it may also be corresponding one of the first lenses ML1). Here the plurality of first color filters are divided into multiple groups of first color filter groups, and each of the first color filter groups includes four first color filters arranged in an array and transmitting wavelength components of different colors.

As an example, each of the first color filter groups includes one first color filter that transmits a blue wavelength component, two first color filters that transmit a green wavelength component and one first color filter that transmits a red wavelength component that are arranged in an array, which may form an RGGB Bayer array. Of course, other feasible arrangements are also possible.

In this embodiment, the first photoelectric conversion elements P1 of the first photoelectric conversion element group and the second photoelectric conversion element P2 arranged in the first photoelectric conversion element group are provided with the same first lens ML1 and the same first color filter, and the first photoelectric conversion element groups at adjacent rows and adjacent columns are provided with different first color filters, so that different wavelength components of different colors are transmitted to generate different charges on the photodiodes.

At the same time, based on the array structure as shown in FIG. 3, in order to realize the incidence of light signals and the transmission of light signals of light provided with different colors, in another embodiment, as shown in FIG. 6, the pixel structure further includes:

a plurality of first lenses ML1, here each of the first lenses ML1 covers corresponding adjacent four first photoelectric conversion elements P1 in each of the four first photoelectric conversion element groups arranged in adjacent rows and adjacent columns and focuses light incident on the first photoelectric conversion elements P1; and a plurality of second lenses ML2, here each of the second lenses ML2 covers corresponding one second photoelectric conversion element P2 and focuses light incident on the second photoelectric conversion element P2.

Additionally, the pixel structure may further include:

a plurality of first color filters, here each of the first color filters is arranged relative to corresponding one first lens ML1, the plurality of first color filters are divided into multiple groups of first color filter groups, and each of the first color filters group includes four first color filters arranged in an array and transmitting wavelength components of different colors;

a plurality of second color filters, here each of the second color filters is disposed relative to a light receiving surface of corresponding one second photoelectric conversion element P2, the plurality of second color filters are divided into multiple groups of second color filter groups, and each of the second color filter groups includes four second color filters arranged in an array and transmitting wavelength components of different colors.

As an example, each of the first color filter groups includes one first color filter transmitting a blue wavelength component, two first color filters transmitting a green wavelength component and one first color filter transmitting a red wavelength component that are arranged in an array, which may form an RGGB Bayer array. Of course, other feasible arrangements are also possible.

As an example, each of the second color filter groups includes one second color filter transmitting a blue wavelength component, two second color filters transmitting a green wavelength component and one second color filter transmitting a red wavelength component that are arranged in an array, which may form an RGGB Bayer array. Of course, other feasible arrangements are also possible.

In this embodiment, the first lens ML1 covers the corresponding adjacent four first photoelectric conversion elements P1 in each of the four first photoelectric conversion element groups arranged at adjacent rows and adjacent columns, and the first color filters are arranged correspondingly to the first photoelectric conversion elements P1 (for example, the first color filters may also be arranged correspondingly to the first lens ML1).

The second photoelectric conversion element P2 provided in the first photoelectric conversion element group is independently provided with the second lens ML2 and the corresponding color filter. Among them, the four first color filters at adjacent rows and adjacent columns can transmit the wavelength components of blue B, green Gr, green Gb, and red R.

As an example, in this embodiment, each of the first photoelectric conversion elements P1 is provided with the corresponding first lens ML1 and the corresponding first color filter, and each of the second photoelectric conversion elements P2 is provided with the corresponding second lens ML2 and the corresponding second color filter; further, in order to achieve the balance and stability of the pixel structure, a center position of the first photoelectric conversion element group where no second photoelectric conversion element P2 is provided is further covered with a virtual lens ML3, the virtual lens ML3 is located at a center position of four of the first lenses, and the virtual lens ML3 and the second lens ML2 are filled at the center positions of any four of the first lenses.

Figure 5:
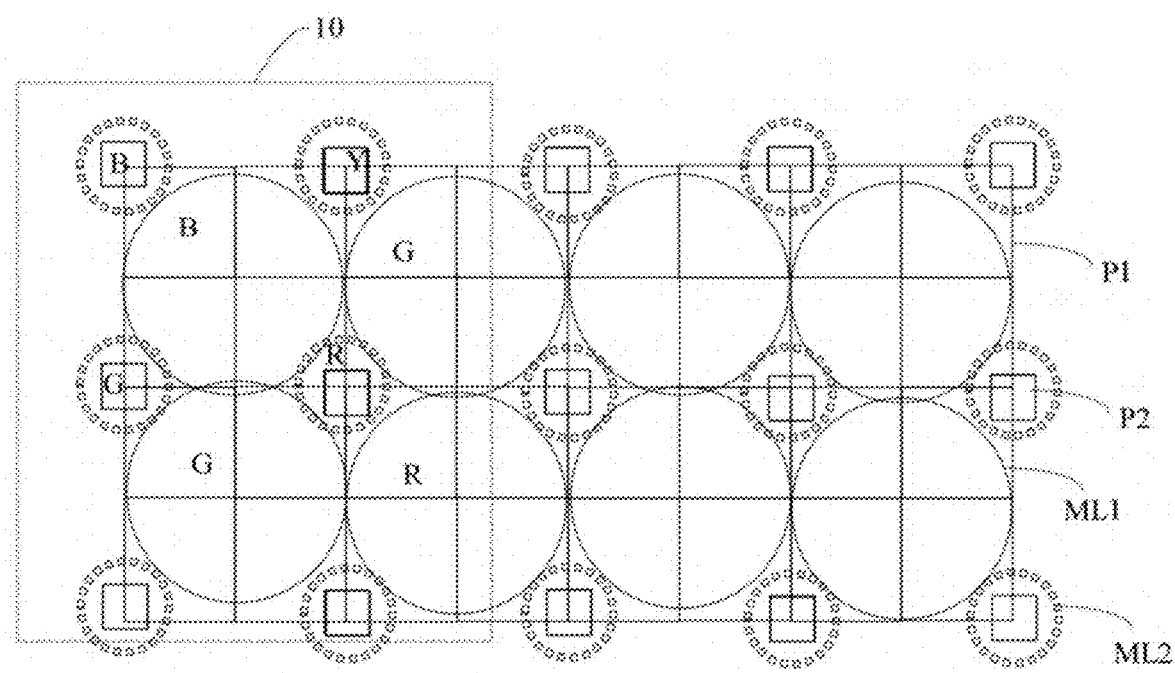
FIG. 5 is a third structural schematic diagram of the pixel structure provided by an embodiment of the present application.

The present application is described more detailedly on the basis of the first embodiment, as shown in FIG. 3, in one embodiment referring to FIG. 5, the first photoelectric conversion elements P1 are divided into a plurality of first photoelectric conversion element groups, the plurality of first photoelectric conversion element groups are arranged in an array, each of the first photoelectric conversion element groups includes four first photoelectric conversion elements P1 arranged at adjacent rows and adjacent columns, and each of the second photoelectric conversion elements P2 is arranged at a center position of the four first photoelectric conversion element groups arranged at adjacent rows and adjacent columns, and no second photoelectric conversion element P2 is arranged between the adjacent first photoelectric conversion element groups;

the first photoelectric conversion elements P1 in each of the first photoelectric conversion element groups are correspondingly coupled to the same first floating diffusion area and the same first output circuit through the first transfer transistors TX1.

As an example, the same first floating diffusion area includes two floating diffusion nodes with each correspondingly shared by two of the first photoelectric conversion elements P1; that is to say, each of the first photoelectric conversion elements P1 corresponds to one transfer transistor, and each two first photoelectric conversion elements P1 corresponds to one floating diffusion point, so that in a first photoelectric conversion element group, two floating diffusion points constitute one first floating diffusion area.

As an example, the same first output circuit includes one output circuit shared by four of the first photoelectric conversion elements. That is to say, in this example, four of the first photoelectric conversion elements P1 share one output circuit. In an optional example, the shared output circuit may include a reset transistor, a source follower transistor, and a row selection transistor.

As an example, the four first photoelectric conversion elements in each of the first photoelectric conversion element groups are arranged in a matrix and form a row-direction space area and a column-direction space area;

the first transfer transistors connected to the corresponding first photoelectric conversion elements in each of the first photoelectric conversion element groups are arranged at an oblique angle at corners of their corresponding first photoelectric conversion elements, and are connected to the same first floating diffusion area and the same first output circuit via connecting wires; the first output circuit is arranged along the row-direction and/or column-direction space area of each of the first photoelectric conversion element groups, that is to say, the transistors in the first output circuit may be arranged in the row-direction space area or arranged in the column-direction space area, or arranged in both kinds of space areas.

At the same time, based on the array structure as shown in FIG. 3, in order to realize the incidence of light signals and the transmission of light signals of light having different colors, in one embodiment as shown in FIG. 5, the pixel structure further includes:

a plurality of first lenses ML1, here each of the first lenses ML1 covers corresponding one of the first photoelectric conversion element groups and focuses the light incident on the first photoelectric conversion elements P1; and a plurality of second lenses ML2, here each of the second lenses ML2 covers corresponding one of the second photoelectric conversion elements P2 and focuses the light incident on the corresponding second photoelectric conversion element P2.

Additionally, the pixel structure may further include:

a plurality of first color filters, here each of the first color filters is arranged relative to corresponding one first photoelectric conversion element group, the plurality of first color filters are divided into multiple groups of first color filter groups, each of the first color filter groups includes four first color filters arranged in an array and transmitting wavelength components of different colors, and in this example the four first photoelectric conversion elements P1 in each of the groups are correspondingly provided with the same kind of color filters; and a plurality of second color filters, here each of the second color filters is disposed relative to a light receiving surface of corresponding one of the second photoelectric conversion elements P2, the plurality of second color filters are divided into multiple groups of second color filter groups, and each of the second color filter groups includes four second color filters arranged in an array and transmitting wavelength components of different colors.

As an example, each of the first color filter groups includes one first color filter transmitting a blue wavelength component, two first color filters transmitting a green wavelength component and one first color filter transmitting a red wavelength component that are arranged in an array, which may form an RGGB Bayer array. Of course, other feasible arrangements are also possible.

As an example, each of the second color filter groups includes one second color filter transmitting a blue wavelength component, two second color filters transmitting a green wavelength component and one second color filter transmitting a red wavelength component that are arranged in an array, which may form an RGGB Bayer array. Of course, other feasible arrangements are also possible.

In this embodiment, the first lens ML1 covers the corresponding adjacent four first photoelectric conversion elements P1 in each of the four first photoelectric conversion element groups arranged at adjacent rows and adjacent columns, and the first color filter is arranged correspondingly to the first lens ML1, that is to say, the same color filter is provided on the adjacent four first photoelectric conversion elements P1 in each of the four first photoelectric conversion element groups arranged at adjacent rows and adjacent columns, which can transmit wavelength components having the same color.

While the second photoelectric conversion element P2 arranged in the first photoelectric conversion element group is independently provided with the second lens ML2 and the corresponding color filter, and the four first color filters at adjacent rows and adjacent columns can transmit wavelength components of blue B, green Gr, green Gb, and red R.

Figure 14:
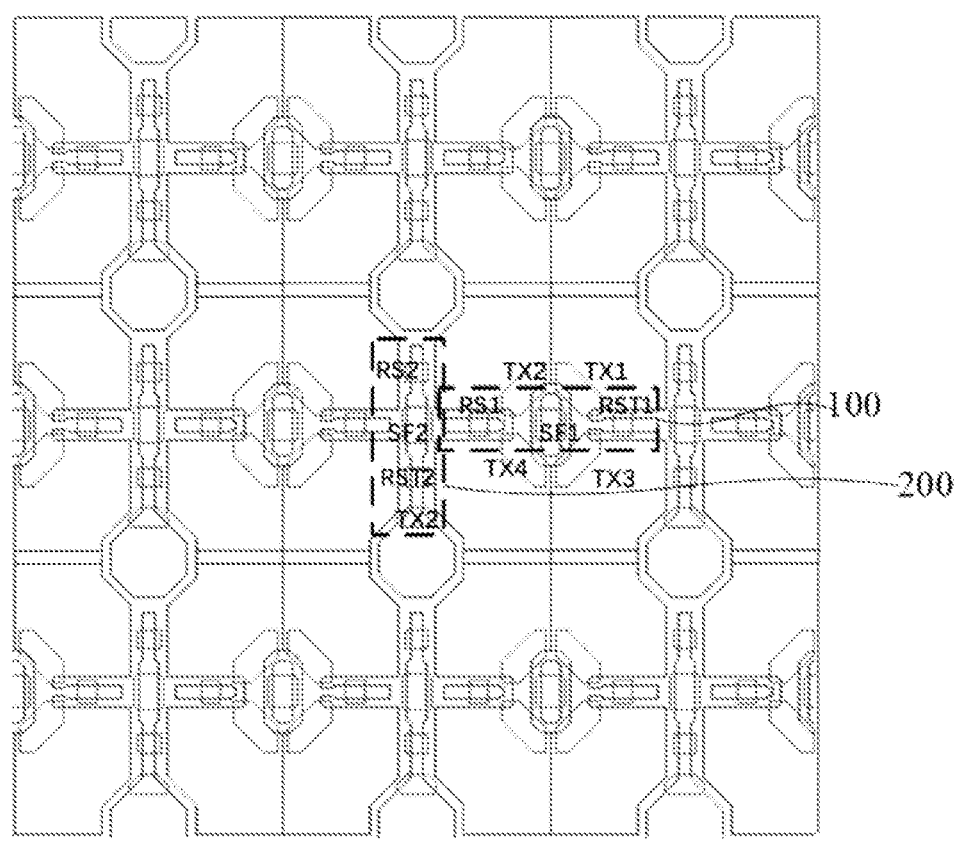
FIG. 14 is a schematic diagram of a layout of the pixel structure provided by the present application.

As an example, referring to FIG. 14, the four first photoelectric conversion elements in each of the first photoelectric conversion element groups are arranged in a matrix and form a row-direction space area and a column-direction space area; here, as shown in FIG. 14, two groups of first photoelectric conversion elements form the row-direction space area 100 and two groups of first photoelectric conversion elements form the column-direction space area 200.

Here, the first transfer transistors connected to the corresponding first photoelectric conversion elements in each of the first photoelectric conversion element groups are arranged at an oblique angle at corners of their corresponding first photoelectric conversion elements to form an opening, and are connected to the same first floating diffusion SF1 and the same first output circuit through connecting wires, and the first output circuit is arranged along the row-direction and/or column-direction space area in each of the first photoelectric conversion element groups. In the example as shown in FIG. 14, the first output circuit is arranged along the row-direction space area 100, in this example, the first output circuit includes one reset transistor RST1, one source follower transistor SF1 and one row selection transistor RS1.

In a further example, a second output circuit may be arranged in the column-direction and/or row-direction space area, the first output circuit is arranged along the column-direction space area 200 in the example as shown in FIG. 14, and in this example the second output circuit includes one reset transistor RST2, one source follower transistor SF2 and one row selection transistor RS2. Of course, the arrangements of the first output circuit and the second output circuit may also be other layouts for realizing the solutions of the present application.

Third Embodiment

The present application is described more detailedly on the basis of the first embodiment. As shown in FIG. 7, in one embodiment, the first photoelectric conversion elements P1 are divided into a plurality of first photoelectric conversion element groups, the plurality of first photoelectric conversion element groups are arranged in an array, each of the first photoelectric conversion element groups includes two first photoelectric conversion elements P1 arranged at adjacent two columns, and each of the second photoelectric conversion elements P2 is deposited at a center position of corresponding four first photoelectric conversion element groups arranged at adjacent rows and adjacent columns. In other words, along the row direction, two second photoelectric conversion elements P2 arranged along the column direction are formed between adjacent two first photoelectric conversion element groups, and adjacent two columns of the second photoelectric conversion elements P2 are provided with adjacent two columns of first photoelectric conversion elements P1 therebetween.

The first photoelectric conversion elements in each of the first photoelectric conversion element groups are correspondingly coupled to the same first floating diffusion area and the same first output circuit through the corresponding first transfer transistors.

In this embodiment, every two first photoelectric conversion elements P1 arranged at adjacent columns constitute one first photoelectric conversion element group, and at the same time the two first photoelectric conversion elements P1 in each group are coupled to the same first floating diffusion area through the corresponding transfer transistors, and the two correspondingly connected first transfer transistors TX1 receive the same control signal and are turned on or off synchronously, so that the charges from the two first photoelectric conversion elements P1 are fed back to the same first floating diffusion area, and the voltage signals are output through the first output circuit that is commonly coupled by the two first photoelectric conversion elements P1 to realize the function of the first pixel.

Figure 8:
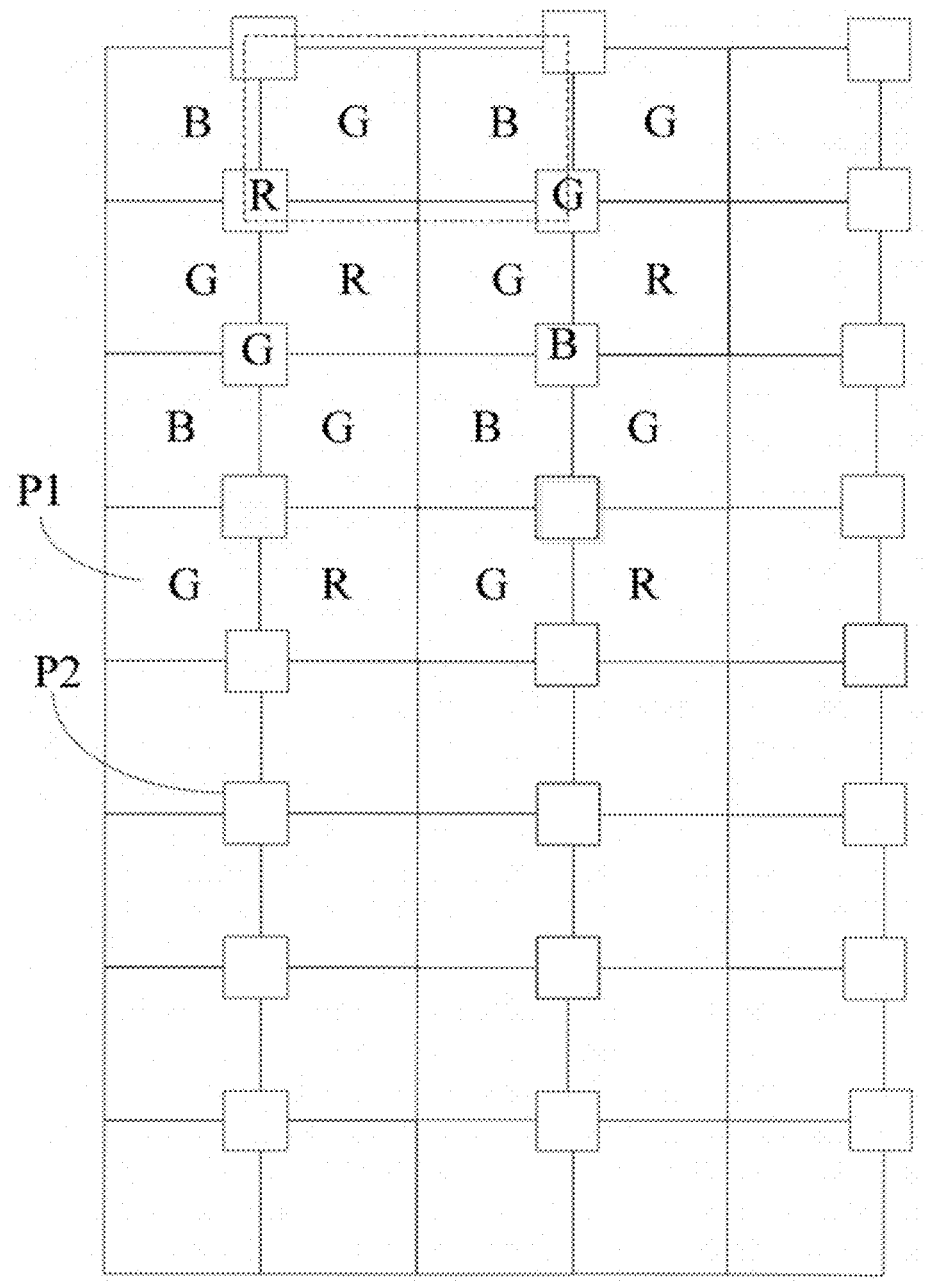
FIG. 8 is a sixth structural schematic diagram of the pixel structure provided by an embodiment of the present application.
Figure 9:
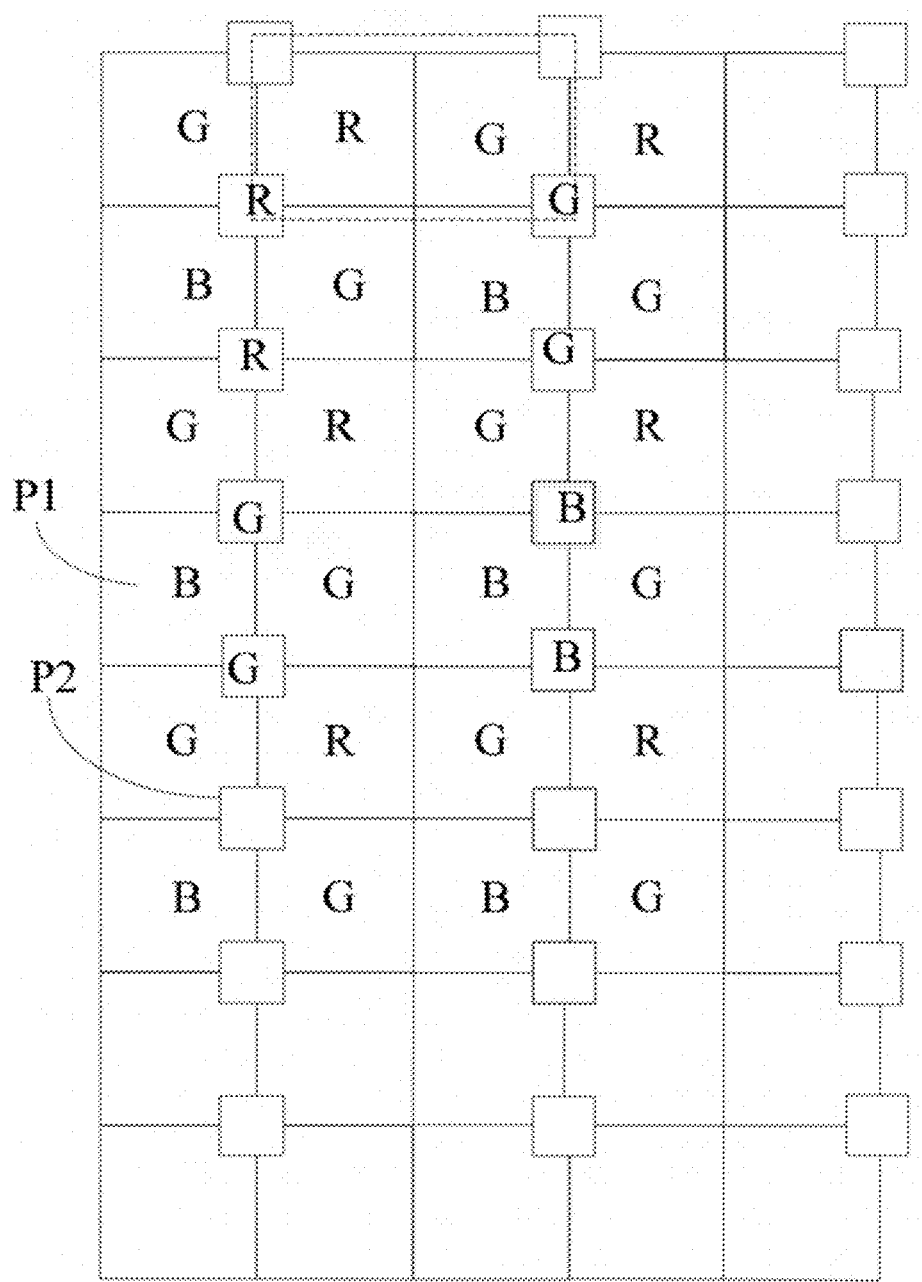
FIG. 9 is a seventh structural schematic diagram of the pixel structure provided by an embodiment of the present application.

Based on the array structure as shown in FIG. 7, in order to realize the transmission of light signals of light having different colors, in another embodiment as shown in FIG. 8 and FIG. 9, the pixel structure further includes:

a plurality of first lenses, here each of the first lenses covers corresponding one of the first photoelectric conversion elements and focuses the light incident on the corresponding one of the first photoelectric conversion elements; and a plurality of second lenses, here each of the second lenses covers corresponding one of the second photoelectric conversion elements and focuses the light incident on the corresponding one of the second photoelectric conversion elements.

Additionally, as shown in FIG. 8, the pixel structure may further include:

a plurality of first color filters, here each of the first color filters is disposed relative to corresponding one of the first photoelectric conversion elements, the plurality of first color filters are divided into multiple groups of first color filter groups, and each of the first color filter groups includes four first color filters arranged in an array and transmitting wavelength components of different colors; and a plurality of second color filters, here each of the second color filters is disposed relative to corresponding one of the second photoelectric conversion elements, the plurality of second color filters are divided into multiple groups of second color filter groups, and each of the second color filter groups includes four second color filters arranged in an array and transmitting wavelength components of different colors.

As an example, regarding the plurality of first color filters, each of the first color filters is disposed relative to the corresponding one of the first photoelectric conversion elements P1, where the plurality of first color filters are divided into multiple groups of first color filter groups, and each of the first color filter groups includes four first color filters arranged in an array and transmitting wavelength components of different colors. Each of the first color filter groups includes one first color filter transmitting a blue wavelength component, two first color filters transmitting a green wavelength component and one first color filter transmitting a red wavelength component that are arranged in an array, which may form an RGGB Bayer array. Of course, other feasible arrangements are also possible.

As an example, each of the second color filter groups includes one second color filter transmitting a blue wavelength component, two second color filters transmitting a green wavelength component and one second color filter transmitting a red wavelength component that are arranged in an array, which may form an RGGB Bayer array. Of course, other feasible arrangements are also possible.

In this embodiment, every two first photoelectric conversion element groups arranged at adjacent columns constitute one pixel unit, and the wavelength components of blue B, green Gr, green Gb and red R are transmitted through the first color filters to the first photoelectric conversion elements P1 so as to provide voltage signals of corresponding magnitudes, meanwhile the four second photoelectric conversion elements P2 disposed at adjacent rows constitute one pixel unit, and the wavelength components of the blue B and green Gb at the same column and the wavelength components of the green Gr and red R at the adjacent column are transmitted through the second color filters to the four second photoelectric conversion elements P2 so as to provide voltage signals of corresponding magnitudes.

Additionally, as shown in FIG. 9, the pixel structure may further include:

a plurality of first color filters, here each of the first color filters is disposed relative to corresponding one of the first photoelectric conversion elements, the plurality of first color filters are divided into multiple groups of first color filter groups, and each of the first color filter groups includes four first color filters arranged in an array and transmitting wavelength components of different colors; and a plurality of second color filters, here each of the second color filters is disposed relative to corresponding one of the second photoelectric conversion elements, the plurality of second color filters are divided into multiple groups of second color filter groups, and each of the second color filter groups includes eight second color filters arranged in an array and transmitting wavelength components of different colors.

As an example, regarding the plurality of first color filters, each of the first color filters is disposed relative to correspondingly one of the first photoelectric conversion elements P1, where the plurality of first color filters are divided into multiple groups of first color filter groups, and each of the first color filter groups includes four first color filters arranged in an array and transmitting wavelength components of different colors. Each of the first color filter groups includes one first color filter transmitting a blue wavelength component, two first color filters transmitting a green wavelength component and one first color filter transmitting a red wavelength component that are arranged in an array, which may form an RGGB Bayer array. Of course, other feasible arrangements are also possible.

As an example, each of the second color filter groups includes two second color filters transmitting a blue wavelength component, four second color filters transmitting a green wavelength component and two second color filters transmitting a red wavelength component that are arranged in an array. Of course, other feasible arrangements are also possible.

In this embodiment, every two first photoelectric conversion element groups disposed at adjacent columns constitute one pixel unit, and the wavelength components of blue B, green Gr, green Gb, and red R are transmitted through the first color filters to the first photoelectric conversion elements P1 so as to provide voltage signals of corresponding magnitudes, meanwhile the eight second photoelectric conversion elements P2 disposed at adjacent rows constitute one pixel unit, and the wavelength components of the blue B, blue B, green Gr and green Gr at the same column and the wavelength components of the green Gb, green Gb, red R and red R at the adjacent column are transmitted through the second color filters to the eight second photoelectric conversion elements P2 so as to provide voltage signals of corresponding magnitudes.

Figure 15:
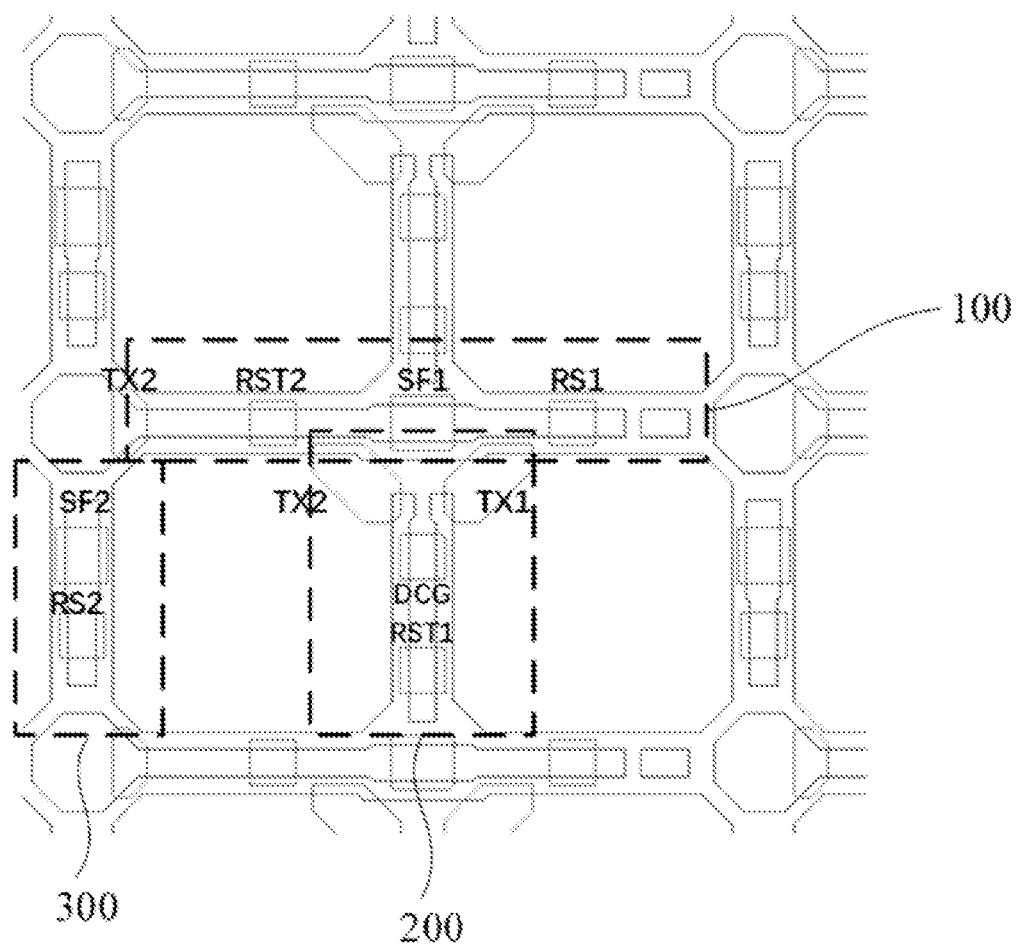
FIG. 15 is a schematic diagram of a layout of another pixel structure provided by the present application.

As an example, referring to FIG. 15, the two first photoelectric conversion elements in each of the first photoelectric conversion element groups are arranged along the row direction to form a column-direction spacer area 200, and adjacent two of the first photoelectric conversion element groups are arranged along the column direction to form a row-direction space area 100; additionally, FIG. 15 also shows a column-direction space region 300 formed through arranging adjacent two first photoelectric conversion element groups along the row direction.

Here, the first transfer transistors connected to the corresponding first photoelectric conversion elements in each of the first photoelectric conversion element groups are arranged at an oblique angle at corners of their corresponding first photoelectric conversion elements, and are connected to the same first floating diffusion area and the same first output circuit via connection wires, and each of the output circuits is disposed along the row-direction space area in each of the first photoelectric conversion element groups and/or the column-direction space area of corresponding adjacent two of the first photoelectric conversion element groups. In the example as shown in FIG. 15, the first output circuits are distributed in the column-direction space area 200 and the row-direction space area 100. In an example, the first output circuit includes one reset transistor RST1, one source follower transistor SF1 and one row selection transistor RS1.

In a further example, as shown in FIG. 15, the second output circuits are distributed in the column-direction space area 300 and the row-direction space area 100. In an example, the second output circuit includes one reset transistor RST2, one source follower transistor SF2 and one row selection transistor RS2. Of course, the arrangements of the first output circuit and the second output circuit may also be other layouts for realizing the solutions of the present application.

Fourth Embodiment

The present application further provides an image sensor, which includes the pixel structure according to any of the foregoing solutions. The image sensor in this embodiment may be a CMOS image sensor, or may be any of other image sensors that can use the pixel structure described in the foregoing embodiments.

Fifth Embodiment

The present application further proposes an electronic device, such as a vehicle-mounted device, which includes an image sensor and a specific structure of the image sensor refers to the foregoing embodiments. Since the vehicle-mounted device adopts all the technical solutions of all the foregoing embodiments, therefore, it has at least all the beneficial effects brought about by the technical solutions of the foregoing embodiments, which will not be repeated herein again. Of course, the electronic device in this embodiment may also be a monitoring device, a vision machine, a drone, a mobile phone, a camera, and the like.

Sixth Embodiment

Another aspect of the present application further provides an image processing method for an image sensor, which is suitable for the image sensor according to any of the foregoing solutions, and the image processing method includes:
  acquiring a first image based on the first photoelectric conversion elements P1; here pixel values of the first photoelectric conversion elements P1 may be read out by using a pixel readout method in the prior art, and image signal processing (ISP) may also be further performed so as to acquire the first image corresponding to the pixel information of the first photoelectric conversion elements P1;
  acquiring a second image based on the second photoelectric conversion elements P2; here, similarly, pixel values of the second photoelectric conversion elements P2 may be read out by using a pixel readout method in the prior art, and image signal processing (ISP) may also be further performed so as to acquire the second image corresponding to the pixel information of the second photoelectric conversion elements P2;
  performing interpolation processing such that the number of the pixel values in the second image corresponding to the second photoelectric conversion elements P2 is equal to the number of the pixel values in the first image corresponding to the first photoelectric conversion elements P1.

Specifically, when, in the image sensor, the number of the pixel values corresponding to the second photoelectric conversion elements P2 is different from the number of the pixel values corresponding to the first photoelectric conversion elements P1, that is, when the number of the first photoelectric conversion elements P1 and the number of second photoelectric conversion elements P2 in the pixel structure of the image sensor are not equal, the two may be processed to have the same number of pixel values through the interpolation processing. That is to say, through the processing of this step, the number of the pixel value information contained in the first image is equal to the number of the pixel value information contained in the second image. It should be noted that the order of the above steps does not strictly represent the order of the steps of the image processing method protected by the present application, and those skilled in the art can change the order according to actual conditions based on the above steps.

As an example, the interpolation processing includes: performing at least one multiplication and interpolation process on the second image to acquire a multiplication image, wherein the second image serves as an initial image currently to be interpolated, and during each multiplication and interpolation process: the image currently to be interpolated is processed to be an updated interpolated image, and the number of pixel values in the updated interpolated image is at least twice the number of the pixel values in the image currently to be interpolated, wherein the pixel values in the updated interpolated image comprise first pixel values and second pixel values, the first pixel values have one-to-one correspondence with the pixel values in the image currently to be interpolated, and the second pixel values are acquired through interpolation on the pixel values of the image currently to be interpolated.

Specifically, performing at least one multiplication and interpolation process on the second image to acquire a multiplication image, here the multiplication and interpolation process makes the number of the pixel values in the updated interpolated image at least twice the number of pixel values in the current image. That is to say, through the processing method of the present application, the number of the pixel values in the image after the interpolation processing may be an even multiple of the number of the pixel values in the original image before the interpolation processing. It should be noted that when the number of pixel values that need to be interpolated is more than the even multiple number of the pixel values, the pixel values may also be supplemented by other supplementary methods, so as to acquire the processed image having the required number of pixel values.

Specifically, the number of the pixel values in the second image corresponding to the second photoelectric conversion elements P2 may be made the same as the number of the pixel values in the first image corresponding to the first photoelectric conversion elements P1 through an upsampling algorithm based on Cubic interpolation. The interpolation may be performed only in a single direction (such as the row direction or the column direction), or may be Bicubic interpolation. In the embodiment of the present application, the Bicubic interpolation is preferably performed. In a specific embodiment, for example, for the second image in an m*n arrangement (that is, the second photoelectric conversion elements P2 are arranged as an array having a size of m*n), the multiplication image having a size of such as 2m*2n, 4m*4n or the like may be acquired based on the multiplication and interpolation processing method, which may be applied to the case where the ratio of the first photoelectric conversion element sP1 to the second photoelectric conversion elements P2 is 2:1 and 4:1. In an example, for the second image arranged as m*n, it is firstly performed by the multiplication and interpolation processing according to the rows (for example, n pixel values at the first row are interpolated into 2n pixel values, and the rest rows may be deduced by analogy until the n pixel values at the m-th row into 2n pixel values) to realize the multiplication in the row direction; then, it is performed by the interpolation processing according to the column direction (for example, the m pixel values at the first column are interpolated into 2m pixel values, and the rest columns may be deduced by analogy until the m pixel values at the n-th column are interpolated into 2m pixel values) to realize the multiplication in the column direction.

In an example, the above-mentioned multiplication and interpolation processing method may be that: the pixel values of the image after the multiplication and interpolation processing include first pixel values and second pixel values, the first pixel values have one-to-one correspondence to the pixel values in the current image to be interpolated, and the second pixel values are obtained based on interpolation on the pixel values of the current image to be interpolated.

Figure 10:
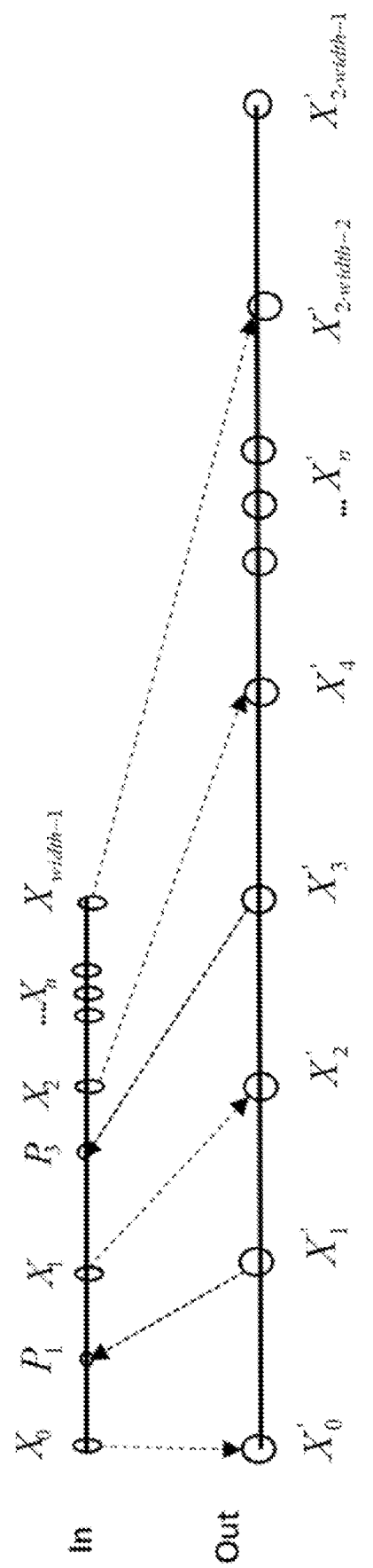
FIG. 10 is a schematic diagram of a multiplication and interpolation processing process of the image processing method provided by an embodiment of the present application.

Specifically, regarding the multiplication processing method in the above example, for the second image in an m*n arrangement, an operation of interpolating n pixel values at the m-th row into 2n pixel values is described as an example. As shown in FIG. 10, the n pixel values at the m-th row are expressed as X0, X1, . . . , Xwidth-1, and the pixel values in the image after the multiplication and interpolation are expressed as X0', X1', . . . , X2width-1'.

Further, a way to assign values to the image after processed by multiplication and interpolation is to: assign the pixel value of X0 to X0', assign the pixel value of X1 to X2', assign the pixel value of X2 to X4' and so on, until assign the pixel value of Xwidth-1 to X2width-2'; then, the pixel value X1' in the image after processed by the multiplication and interpolation may be obtained by performing interpolation on the pixel values X0 and X1 in the current image to be interpolated, and the pixel value X3' may be obtained by performing interpolation on the pixel values X1 and X2 in the current image to be interpolated. Here, the interpolation may be acquiring an average value of two values, such as X1'=(X0+X1)/2. Of course, the interpolation may also be a calculation method that assigns different weights to different values, which is not limited to this. In addition, for the pixel value X2width-1' in the image processed by the multiplication and interpolation, it may be acquired by multiplying Xwidth-1 with a percentage or directly assigning the pixel value of Xwidth-1 to X2width-1'. Similarly, the multiplied image may also be acquired by using other suitable processing methods.

It should also be noted that if it is necessary to interpolate the second image provided with the m*n arrangement into a second image provided with a 4m*4n arrangement, this may be achieved by performing the multiplication and interpolation processing two times; of course, this may also be achieved according to a similar method like the above-mentioned method, that is, the pixel values of the image processed through the multiplication and interpolation include the first pixel values and the second pixel values, the first pixel values have one-to-one correspondence with the pixel values of the current image to be interpolated, and the remaining second pixel values may be acquired based on interpolation on the pixel values of the current image to be interpolated, for example, the pixel value of X0 is assigned to X0' and the pixel value of X1 is assigned to X4', and then the pixel values of X1', X2' and X3' may be obtained based on the pixel values of X0 and X1 (for example, obtained based on interpolation in which different weights are assigned to the pixel values of X0 and X1).

Seventh Embodiment

Another aspect of the present application provides an image sensor control method, which is applied to the image sensor according to any of the above solutions, and the control method includes separately reading out information of the first pixels and information of the second pixels, where the reading out the information of the first pixels and the information of the second pixels specifically includes:

1) resetting a storage area in the first pixel, and quantizing it to acquire a first image reset signal;
2) transmitting image information corresponding to the first photoelectric conversion element P1, and quantizing it to obtain a first image sampling signal;
3) transmitting image information corresponding to the second photoelectric conversion element P2, and quantizing it to acquire a second image sampling signal;
where a first actual image signal of the first pixel is acquired based on the first image reset signal and the first image sampling signal, and a second actual image signal of the second pixel is acquired based on the second image sampling signal. It should be noted that the order of the above steps does not strictly represent the order of the steps of the image sensor control method protected by the present application, and those skilled in the art can change the steps according to actual needs based on the above steps.

Figure 11:
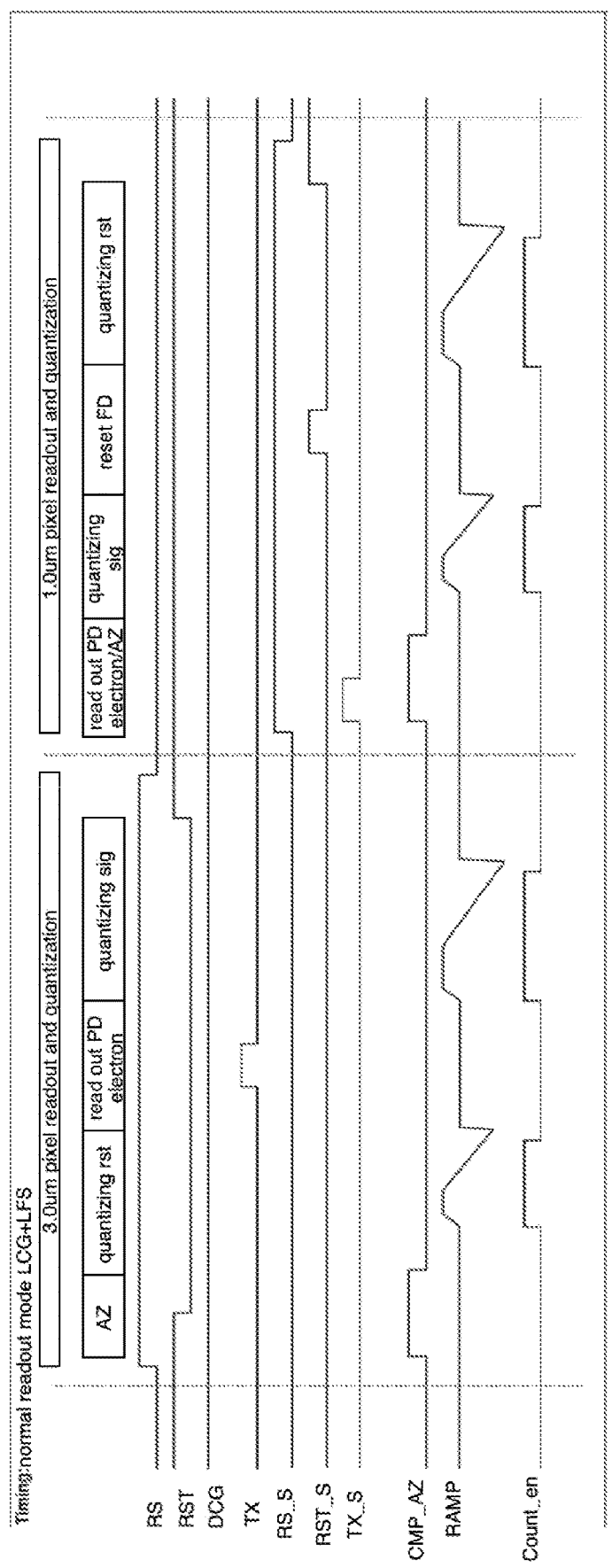
FIG. 11 is a first schematic diagram of a playback mode of a first pixel and a second pixel in the control method of the present application.
Figure 12:
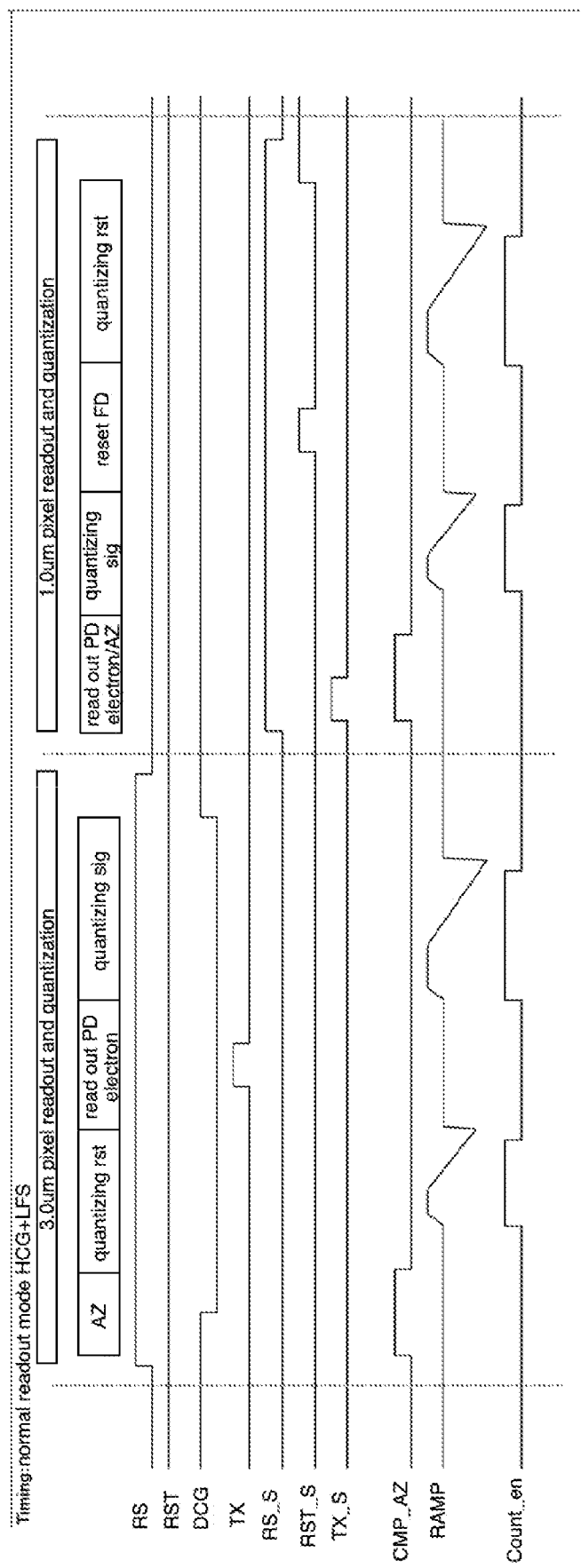
FIG. 12 is a second schematic diagram of a playback mode of a first pixel and a second pixel in the control method of the present application.
Figure 13:
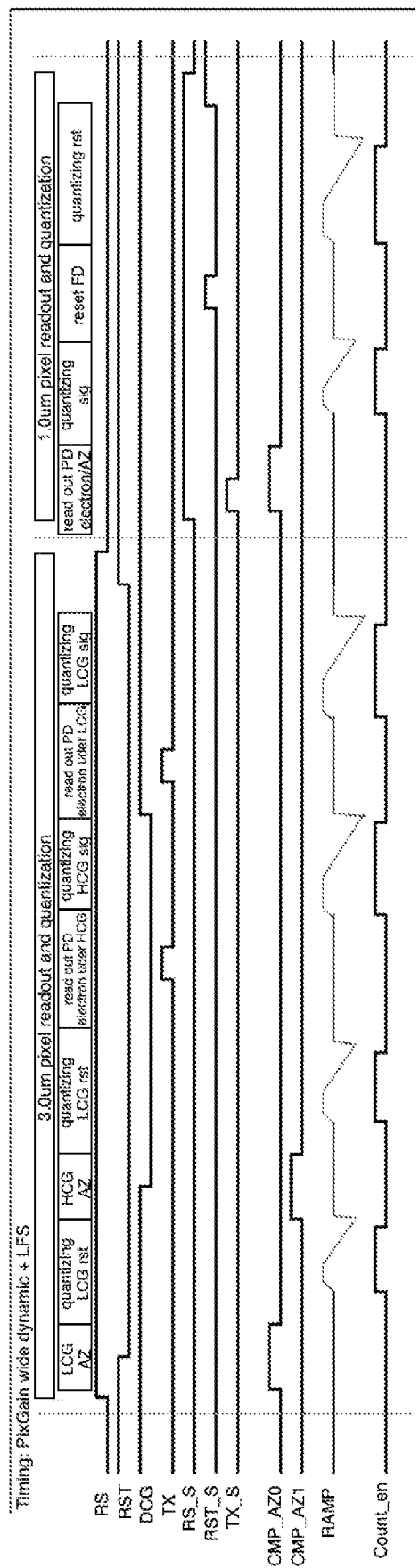
FIG. 13 is a third schematic diagram of a playback mode of a first pixel and a second pixel in the control method of the present application.

As an example, the process of reading out the information of the second pixel further includes: resetting a storage area in the second pixel, and quantizing it to obtain a second image reset signal; and acquiring the second actual image signal of the second pixel based on the second image reset signal and the second image sampling signal. Among them, the reset signal quantization in this example may occur after the step 3), or occur between the step 2) and the step 3), preferably, in this embodiment, as shown in FIGS. 11-13, the reset and quantization process of the second pixel is carried out after step 3). Additionally, it should be noted that in FIGS. 11-13 the 3.0 μm pixel represents an example of the first pixel and the 1.0 μm pixel represents an example of the second pixel, which are taken as examples for schematic illustration. Moreover, the signals (such as the second image sampling signal) represent signals representing the image information or the reset information read out according to time sequence, and does not necessarily represent a specific signal data.

As an example, the readout mode of the first pixel may be reading in a low conversion gain mode (referring to FIG. 11), or may be reading in a high conversion gain mode (referring to FIG. 12), of course may also be reading in both the low conversion gain mode and the high conversion gain mode (referring to FIG. 13) to achieve high dynamic range. Among them, the high conversion gain mode and the low conversion gain mode may be realized by: preparing a conversion gain transistor DCG between a reset transistor RST1 of the first pixel and a first floating diffusion area, and further optionally preparing a capacitor between the reset transistor RST1 and the conversion gain transistor DCG, and achieving the mode of the low conversion gain and high conversion gain through turn-on and turn-off the conversion gain transistor DCG. Of course, other methods well known in the art may also be used. Based on the above-mentioned readout mode and the pixel structure of the present application, a conventional exposure method may be used to continuously expose both the first photoelectric conversion element P1 and the second photoelectric conversion element P2, and the exposure time may be set according to a practice to realize flickering control of the light source, thereby it is possible to acquire photography of a high-quality image of an environment provided with a flickering light source. Of course, other exposure readout modes may also be designed.

Here, when both the low conversion gain mode and the high conversion gain mode are adopted to read out the first pixel, referring to FIG. 13, the readout method of the first pixel includes steps of following:

resetting the storage area in the first pixel under the low conversion gain mode, and quantizing it to acquire a first image reset signal under the low conversion gain mode;

resetting the storage area in the first pixel under the high conversion gain mode, and quantizing it to acquire a first image reset signal under the high conversion gain mode;

transmitting image information corresponding to the first photoelectric conversion element P1 under the high conversion gain mode, and quantizing it to acquire a first image sampling signal under the high conversion gain mode;

reassigning image information corresponding to the first photoelectric conversion element P1 under the low conversion gain mode, and quantizing it to acquire a first image sampling signal under the low conversion gain mode;

here the first actual image signal of the first pixel is acquired based on the first image reset signal and first image sampling signal under the low conversion gain mode and the first image reset signal and first image sampling signal under the high conversion gain mode.

The foregoing embodiments are only used to illustrate the technical solutions of the present application, but not to limit the present application. Although the present application has been described in detail with reference to the foregoing embodiments, those of ordinary skill in the art should understand that: they can still modify the technical solutions described in the foregoing various embodiments, or equivalently replace some of the technical features in the technical solutions described in the foregoing various embodiments; and these modifications or replacements do not cause the essence of the corresponding technical solutions to deviate from the spirit and scope of the technical solutions of the embodiments of the present application, and should be included within the protection scope of the present application.

What is claimed is:

1. A pixel structure comprising a plurality of first pixels and a plurality of second pixels,
wherein each of the first pixels comprises:
a first photoelectric conversion element, wherein first photoelectric conversion elements of the plurality of first pixels are arranged in an array;
a first transfer transistor coupled to a first floating diffusion area and configured to transfer charges accumulated by the first photoelectric conversion element to the first floating diffusion area; and
a first output circuit coupled to the first floating diffusion area and configured to output a voltage signal from the first floating diffusion area;
wherein each of the second pixels comprises:
a second photoelectric conversion element, wherein sensitivity of the second photoelectric conversion element is lower than sensitivity of the first photoelectric conversion element, and second photoelectric conversion elements of the plurality of second pixels are arranged in an array;
a second transfer transistor coupled to a second floating diffusion area and configured to transfer charges accumulated by the second photoelectric conversion element to the second floating diffusion area; and a second output circuit coupled to the second floating diffusion area and configured to output a voltage signal from the second floating diffusion area;

wherein each of the second photoelectric conversion elements is arranged at a center position of corresponding four of the first photoelectric conversion elements arranged in an array, and at least one of adjacent two rows or adjacent two columns of the second photoelectric conversion elements are correspondingly provided with at least one of adjacent two rows or adjacent two columns of the first photoelectric conversion elements therebetween; and wherein an area corresponding to a light receiving surface of the first photoelectric conversion element is made larger than an area of a light receiving surface of the second photoelectric conversion element.

2. The pixel structure of claim 1, wherein the second pixel further comprises:
a charge storage element, one terminal of the charge storage element being coupled to the second floating diffusion area and another terminal of the charge storage element being grounded or connected to a variable voltage.

3. The pixel structure of claim 1, wherein the first photoelectric conversion elements are divided into a plurality of first photoelectric conversion element groups, the plurality of first photoelectric conversion element groups are arranged in an array, each of the first photoelectric conversion element groups includes four of the first photoelectric conversion elements arranged at adjacent rows and adjacent columns, each of the second photoelectric conversion elements is arranged at a center position of the four first photoelectric conversion elements of corresponding one of the first photoelectric conversion element groups, and adjacent two of the first photoelectric conversion element groups are not provided with the second photoelectric conversion element therebetween;

each of the first photoelectric conversion elements in each of the first photoelectric conversion element groups is correspondingly coupled to the same first floating diffusion area and the same first output circuit through corresponding one of the first transfer transistors.

4. The pixel structure of claim 3, wherein the same first floating diffusion area comprises four floating diffusion nodes correspondingly coupled to the first photoelectric conversion elements; and/or the same first output circuit comprises four output sub-circuits correspondingly coupled to the first photoelectric conversion elements.

5. The pixel structure of claim 3, wherein the pixel structure further comprises:
a plurality of first lenses, wherein each of the first lenses covers corresponding one of the first photoelectric conversion element groups and focuses light incident on the first photoelectric conversion elements and the second photoelectric conversion element;
and/or
a plurality of first color filters, wherein each of the first color filters is disposed relative to corresponding one of the first photoelectric conversion element groups and the second photoelectric conversion element correspondingly arranged at the center position thereof, wherein the plurality of first color filters are divided into multiple groups of first color filter groups, and each of the first color filter groups comprises corresponding four of the first color filters arranged in an array and transmitting wavelength components of different colors.

6. The pixel structure of claim 3, wherein the pixel structure further comprises:
a plurality of first lenses, wherein each of the first lenses covers corresponding one of the first photoelectric conversion elements and focuses light incident on the corresponding one first photoelectric conversion element; and
a plurality of second lenses, wherein each of the second lenses covers corresponding one of the second photoelectric conversion elements and focuses light incident on the corresponding second photoelectric conversion element;
and/or, the pixel structure further comprises:
a plurality of first color filters, wherein each of the first color filters is disposed relative to corresponding one of the first photoelectric conversion elements, wherein the plurality of first color filters are divided into multiple groups of first color filter groups, and each of the first color filter groups comprises corresponding four of the first color filters arranged in an array and transmitting wavelength components of different colors; and
a plurality of second color filters, wherein each of the second color filters is disposed relative to corresponding one of the second photoelectric conversion elements, wherein the plurality of second color filters are divided into multiple groups of second color filter groups, and each of the second color filter groups comprises corresponding four of the second color filters arranged in an array and transmitting wavelength components of different colors.

7. The pixel structure of claim 6, wherein the pixel structure further comprises:
a plurality of virtual lenses located at center positions of corresponding four of the first lenses, wherein the virtual lenses and the second lenses fill the center positions of any four of the first lenses.

8. The pixel structure of claim 1, wherein the first photoelectric conversion elements are divided into a plurality of first photoelectric conversion element groups, the plurality of first photoelectric conversion element groups are arranged in an array, each of the first photoelectric conversion element groups comprises corresponding four of the first photoelectric conversion elements arranged at adjacent rows and adjacent columns, and each of the second photoelectric conversion elements is arranged at a center position of the corresponding four of the first photoelectric conversion element groups arranged at adjacent rows and adjacent columns;

each of the first photoelectric conversion elements in each of the first photoelectric conversion element groups is respectively coupled to the same first floating diffusion area and the same first output circuit through corresponding one of the first transfer transistors.

9. The pixel structure of claim 8, wherein the same first floating diffusion area comprises two floating diffusion nodes with each shared by two of the first photoelectric conversion elements; and/or, the same first output circuit comprises one output circuit shared by corresponding four of the first photoelectric conversion elements.

10. The pixel structure of claim 8, wherein the pixel structure comprises:
a plurality of first lenses, wherein each of the first lenses covers corresponding one of the first photoelectric conversion element groups and focuses light incident on the corresponding first photoelectric conversion elements; and a plurality of second lenses, wherein each of the second lenses covers corresponding one of the second photoelectric conversion elements and focuses light incident on the corresponding second photoelectric conversion element;

and/or, the pixel structure further comprises:

a plurality of first color filters, wherein each of the first color filters is disposed relative to corresponding one of the first photoelectric conversion element groups, wherein the plurality of first color filters are divided into multiple groups of first color filter groups, and each of the first color filter groups comprises corresponding four of the first color filters arranged in an array and transmitting wavelength components of different colors; and a plurality of second color filters, wherein each of the second color filters is disposed relative to corresponding one of the second photoelectric conversion elements, wherein the plurality of second color filters are divided into multiple groups of second color filter groups, and each of the second color filter groups comprises corresponding four of the second color filters arranged in an array and transmitting wavelength components of different colors.

11. The pixel structure of claim 8, wherein the four first photoelectric conversion elements in each of the first photoelectric conversion element groups are arranged as a matrix and form a row-direction space area and a column-direction space area, the first transfer transistors connected to the photoelectric conversion elements in each of the first photoelectric conversion element groups are arranged at an oblique angle at corners of corresponding first photoelectric conversion elements to form an opening and are connected to the same first floating diffusion area and the same first output circuit, and the first output circuit is arranged along the row-direction and/or column-direction space area in each of the first photoelectric conversion element groups.

12. The pixel structure of claim 1, wherein the first photoelectric conversion elements are divided into a plurality of first photoelectric conversion element groups, the plurality of first photoelectric conversion element groups are arranged in an array, each of the first photoelectric conversion element groups comprises two first photoelectric conversion elements arranged at adjacent two columns, each of the second photoelectric conversion elements is arranged at a center position of four of the first photoelectric conversion element groups arranged at adjacent rows and adjacent columns, and adjacent two columns of the second photoelectric conversion elements are provided with adjacent two columns of the first photoelectric conversion elements therebetween;

each of the first photoelectric conversion elements in each of the first photoelectric conversion element groups is respectively coupled to the same first floating diffusion area and the same first output circuit through corresponding one of the first transfer transistors.

13. The pixel structure of claim 12, wherein the same first floating diffusion area comprises one floating diffusion node shared by two of the first photoelectric conversion elements; and/or, the same first output circuit comprises one output circuit shared by the corresponding two first photoelectric conversion elements; and/or wherein the two first photoelectric conversion elements in each of the first photoelectric conversion element groups are arranged along a column direction to form a row-direction space area, and adjacent two of the first photoelectric conversion element groups are arranged along a row direction to form a column-direction space area; the first transfer transistor connected to the first photoelectric conversion element in each of the first photoelectric conversion element groups are arranged at an oblique angle at corners of corresponding first photoelectric conversion element, and are connected to the same first floating diffusion area and the same first output circuit, and each of the output circuits is arranged along the row-direction space area in each of the first photoelectric conversion element groups and/or the column-direction space area of corresponding adjacent two of the first photoelectric conversion element groups.

14. The pixel structure of claim 12, wherein the pixel structure comprises:

a plurality of first lenses, each of the first lenses covers corresponding one of the first photoelectric conversion elements and focuses light incident on the corresponding first photoelectric conversion element; and a plurality or second lenses, wherein each or the second lenses covers corresponding one of the second photoelectric conversion elements and focuses light incident on the corresponding second photoelectric conversion element;

and/or, the pixel structure comprises:

a plurality of first color filters, wherein each of the first color filters is arranged relative to corresponding one of the first photoelectric conversion elements, wherein the plurality of first color filters are divided into multiple groups of first color filter groups, and each of the first color filter groups comprises corresponding four of the first color filters arranged in an array and transmitting wavelength components of different colors; and a plurality of second color filters, wherein each of the second color filters is disposed relative to corresponding one of the second photoelectric conversion elements, and the plurality of second color filters are divided into multiple groups of second color filter groups, wherein each of the second color filter groups comprises corresponding four of the second color filters arranged in an array and transmitting wavelength components of different colors or comprises corresponding eight of the second color filters arranged in an array and transmitting wavelength components of different colors.

15. An image processing method for an image sensor, applied to an image sensor comprising the pixel structure of claim 1, and comprising:

acquiring a first image based on the first photoelectric conversion elements;

acquiring a second image based on the second photoelectric conversion elements;

performing interpolation processing such that the number of pixel values in the second image is equal to the number of pixel values in the first image.

16. The image processing method for an image sensor of claim 15, wherein the interpolation processing comprises:

performing at least one multiplication and interpolation process on the second image to acquire a multiplication image, the second image serves as an initial image currently to be interpolated, and during each multiplication and interpolation process:

the image currently to be interpolated is processed to be an updated interpolated image, and the number of pixel values in the updated interpolated image is at least twice the number of the pixel values in the image currently to be interpolated, wherein the pixel values in the updated interpolated image comprise first pixel values and second pixel values, the first pixel values have one-to-one correspondence with the pixel values in the image currently to be interpolated, and the second pixel values are acquired through interpolation on the pixel values of the image currently to be interpolated.

17. An image sensor control method, applied to an image sensor comprising the pixel structure of claim 1, comprising:
reading out information of the first pixels, specifically comprising:
resetting a storage area in the first pixels, and quantizing to obtain a first image reset signal; and
transmitting image information corresponding to the first photoelectric conversion elements, and quantizing to obtain a first image sampling signal; and
reading out information of the second pixels, specifically comprising:
transmitting image information corresponding to the second photoelectric conversion elements, and quantizing to obtain a second image sampling signal;
wherein, a first actual image signal of the first pixels is acquired based on the first image reset signal and the first image sampling signal, and a second actual image signal or the second pixels is acquired based on the second image sampling signal.

18. The image sensor control method of claim 17, wherein the reading out the information of the second pixels further comprises:
resetting a storage area in the second pixels, and quantizing to acquire a second image reset signal, and acquiring the second actual image signal based on the second image reset signal and the second image sampling signal.

19. The image sensor control method of claim 18, wherein readout of the first pixels comprises at least one of readout under a low conversion gain mode and readout under a high conversion gain mode, wherein when both the readout under the low conversion gain mode and the readout under the high conversion gain mode are adopted for the first pixels, the readout of the first pixels comprises steps of:
resetting the storage area in the first pixels under the low conversion gain mode, and quantizing to acquire a first image reset signal under the low conversion gain mode;
resetting the storage area in the first pixels under the high conversion gain mode, and quantizing to acquire a first image reset signal under the high conversion gain mode;
transmitting the image information corresponding to the first photoelectric conversion elements under the high conversion gam mode, and quantizing to acquire a first image sampling signal under the high conversion gain mode;
reassigning the image information corresponding to the first photoelectric conversion elements under the low conversion gain mode, and quantizing to acquire a first image sampling signal under the low conversion gain mode;
wherein the first actual image signal of the first pixels is acquired based on the first image reset signal and the first image sampling signal under the low conversion gain mode and the first image reset signal and the first image sampling signal under the high conversion gain mode.

20. An image sensor control method comprising the steps of:
providing a pixel structure comprising a plurality of first pixels and a plurality of second pixels, wherein each of the first pixels comprises: a first photoelectric conversion element, wherein first photoelectric conversion elements of the plurality of first pixels are arranged in an array; a first transfer transistor coupled to a first floating diffusion area and configured to transfer charges accumulated by the first photoelectric conversion element to the first floating diffusion area; and a first output circuit coupled to the first floating diffusion area and configured to output a voltage signal from the first floating diffusion area; wherein each of the second pixels comprises: a second photoelectric conversion element, wherein sensitivity of the second photoelectric conversion element is lower than sensitivity of the first photoelectric conversion element, and second photoelectric conversion elements of the plurality of second pixels are arranged in an array; a second transfer transistor coupled to a second floating diffusion area and configured to transfer charges accumulated by the second photoelectric conversion element to the second floating diffusion area; and a second output circuit coupled to the second floating diffusion area and configured to output a voltage signal from the second floating diffusion area;
reading out information of the first pixels, specifically comprising: resetting a storage area in the first pixels, and quantizing to obtain a first image reset signal; and transmitting image information corresponding to the first photoelectric conversion elements, and quantizing to obtain a first image sampling signal; and
reading out information of the second pixels, specifically comprising: transmitting image information corresponding to the second photoelectric conversion elements, and quantizing to obtain a second image sampling signal; and resetting a storage area in the second pixels, and quantizing to acquire a second image reset signal, and acquiring the second actual image signal based on the second image reset signal and the second image sampling signal,
wherein the readout of the first pixels includes at least one of readout under a low conversion gain mode and readout under a high conversion gain mode, wherein when both the readout under the low conversion gain mode and the readout under the high conversion gain mode are adopted for the first pixels, the readout of the first pixels further comprising the steps of:
resetting the storage area in the first pixels under the low conversion gain mode, and quantizing to acquire a first image reset signal under the low conversion gain mode;
resetting the storage area in the first pixels under the high conversion gain mode, and quantizing to acquire a first image reset signal under the high conversion gain mode;
transmitting the image information corresponding to the first photoelectric conversion elements under the high conversion gam mode, and quantizing to acquire a first image sampling signal under the high conversion gain mode; and
reassigning the image information corresponding to the first photoelectric conversion elements under the low conversion gain mode, and quantizing to acquire a first image sampling signal under the low conversion gain mode,
wherein a first actual image signal of the first pixels is acquired based on the first image reset signal and the first image sampling signal under the low conversion gain mode and the first image reset signal and the first image sampling signal under the high conversion gain mode, and wherein a second actual image signal or the second pixels is acquired based on the second image sampling signal.

* * * * *